(12) United States Patent
Lee

(10) Patent No.: US 10,741,252 B2
(45) Date of Patent: Aug. 11, 2020

(54) APPARATUS AND METHODS FOR PROGRAMMING MEMORY CELLS USING MULTI-STEP PROGRAMMING PULSES

(71) Applicant: MICRON TECHNOLOGY, INC., Boise, ID (US)

(72) Inventor: Eric N. Lee, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/223,305

(22) Filed: Dec. 18, 2018

(65) Prior Publication Data
US 2020/0194070 A1  Jun. 18, 2020

(51) Int. Cl.
*G11C 16/34* (2006.01)
*G11C 16/10* (2006.01)
*G11C 16/04* (2006.01)
*G11C 11/56* (2006.01)

(52) U.S. Cl.
CPC .......... *G11C 16/10* (2013.01); *G11C 16/0483* (2013.01); *G11C 16/3459* (2013.01); *G11C 11/5628* (2013.01); *G11C 11/5671* (2013.01); *G11C 2211/5621* (2013.01)

(58) Field of Classification Search
CPC . G11C 16/10; G11C 16/3459; G11C 16/0483; G11C 11/5628; G11C 11/5671; G11C 2211/5621
See application file for complete search history.

(56) References Cited

U.S. PATENT DOCUMENTS

| | | | |
|---|---|---|---|
| 7,539,057 B2* | 5/2009 | Hwang | G11C 11/5628 365/185.03 |
| 7,692,971 B2 | 4/2010 | Moschiano et al. | |
| 7,903,461 B2 | 3/2011 | Chandrasekhar et al. | |
| 8,416,624 B2* | 4/2013 | Lei | G11C 16/3404 365/185.17 |
| 8,482,983 B2* | 7/2013 | Honma | G11C 16/10 365/185.03 |
| 9,245,645 B2 | 1/2016 | Srinivasan et al. | |
| 9,396,791 B2 | 7/2016 | Raghunathan et al. | |
| 9,460,783 B2 | 10/2016 | Moschiano et al. | |
| 9,767,894 B2 | 9/2017 | Tang et al. | |
| 9,767,909 B1 | 9/2017 | Yip | |
| 9,947,418 B2 | 4/2018 | Helm et al. | |
| 2004/0004857 A1* | 1/2004 | Manea | G11C 11/5628 365/185.03 |
| 2006/0291291 A1* | 12/2006 | Hosono | G11C 16/12 365/185.22 |

(Continued)

*Primary Examiner* — Khamdan N. Alrobaie
(74) *Attorney, Agent, or Firm* — Dicke, Billig & Czaja, PLLC

(57) ABSTRACT

Methods of operating a memory, and memory configured to perform similar methods, might include applying a particular multi-step programming pulse to a selected access line of a programming operation, and applying a next subsequent multi-step programming pulse to the selected access line, wherein the particular multi-step programming pulse has a first step having a first voltage level and a second step having a second voltage level different than the first voltage level, and wherein the next subsequent multi-step programming pulse has a first step having a third voltage level and a second step having a fourth voltage level different than the third voltage level and higher than the first voltage level.

33 Claims, 9 Drawing Sheets

(56) References Cited

U.S. PATENT DOCUMENTS

| | | | |
|---|---|---|---|
| 2007/0030735 A1* | 2/2007 | Crippa | G11C 11/5628 365/185.12 |
| 2011/0069546 A1* | 3/2011 | Watanabe | G11C 11/5628 365/185.03 |
| 2011/0103151 A1* | 5/2011 | Kim | G11C 11/5628 365/185.19 |
| 2013/0039130 A1* | 2/2013 | Lee | G11C 11/5628 365/185.19 |
| 2014/0198570 A1 | 7/2014 | Hsieh et al. | |
| 2015/0357031 A1* | 12/2015 | Tang | G11C 11/5628 711/103 |
| 2018/0061497 A1 | 3/2018 | Vu et al. | |
| 2018/0211715 A1* | 7/2018 | Cho | G11C 11/5628 |
| 2019/0088313 A1* | 3/2019 | Kondo | G11C 16/34 |

* cited by examiner

APPARATUS AND METHODS FOR PROGRAMMING MEMORY CELLS USING MULTI-STEP PROGRAMMING PULSES

TECHNICAL FIELD

The present disclosure relates generally to memory and, in particular, in one or more embodiments, the present disclosure relates to apparatus and methods for programming memory cells using multi-step programming pulses.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Programming in memories is typically accomplished by applying a plurality of programming pulses, separated by verify pulses, to program each memory cell of a selected group of memory cells to a respective intended data state (which may be an interim or final data state). With such a scheme, the programming pulses are applied to access lines, such as those typically referred to as word lines, for selected memory cells. After each programming pulse, one or more verify pulses are used to verify the programming of the selected memory cells. Typical programming operations use many programming pulses in an incremental step pulse programming scheme, where each programming pulse is a single pulse that moves the memory cell threshold voltage by some amount, and each subsequent programming pulse is higher than a preceding programming pulse. Before each programming pulse, word lines may be precharged, and after each programming pulse, the word lines may be discharged. This can lead to high power consumption.

DETAILED DESCRIPTION

Figure 1:
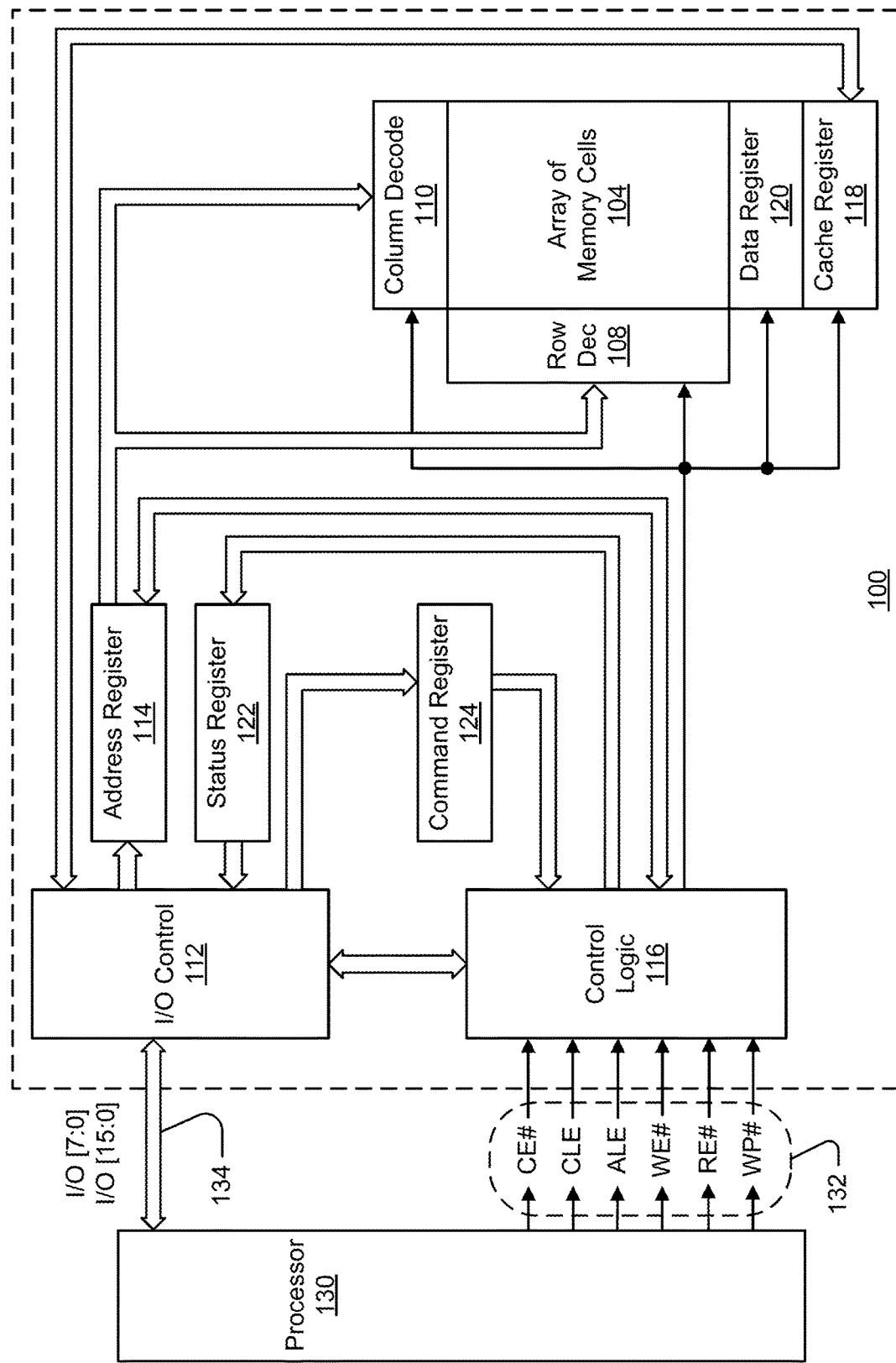
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOT) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
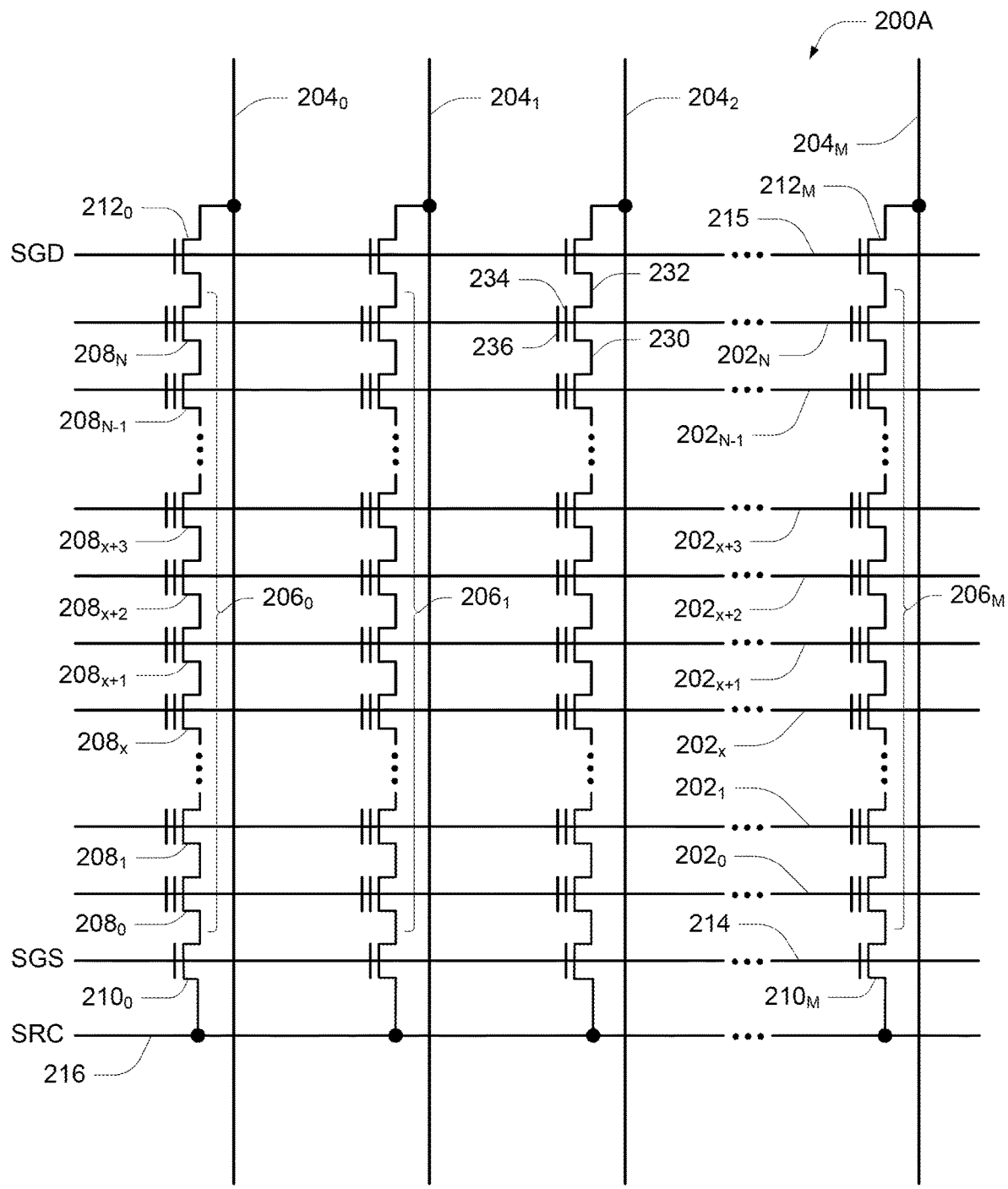
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
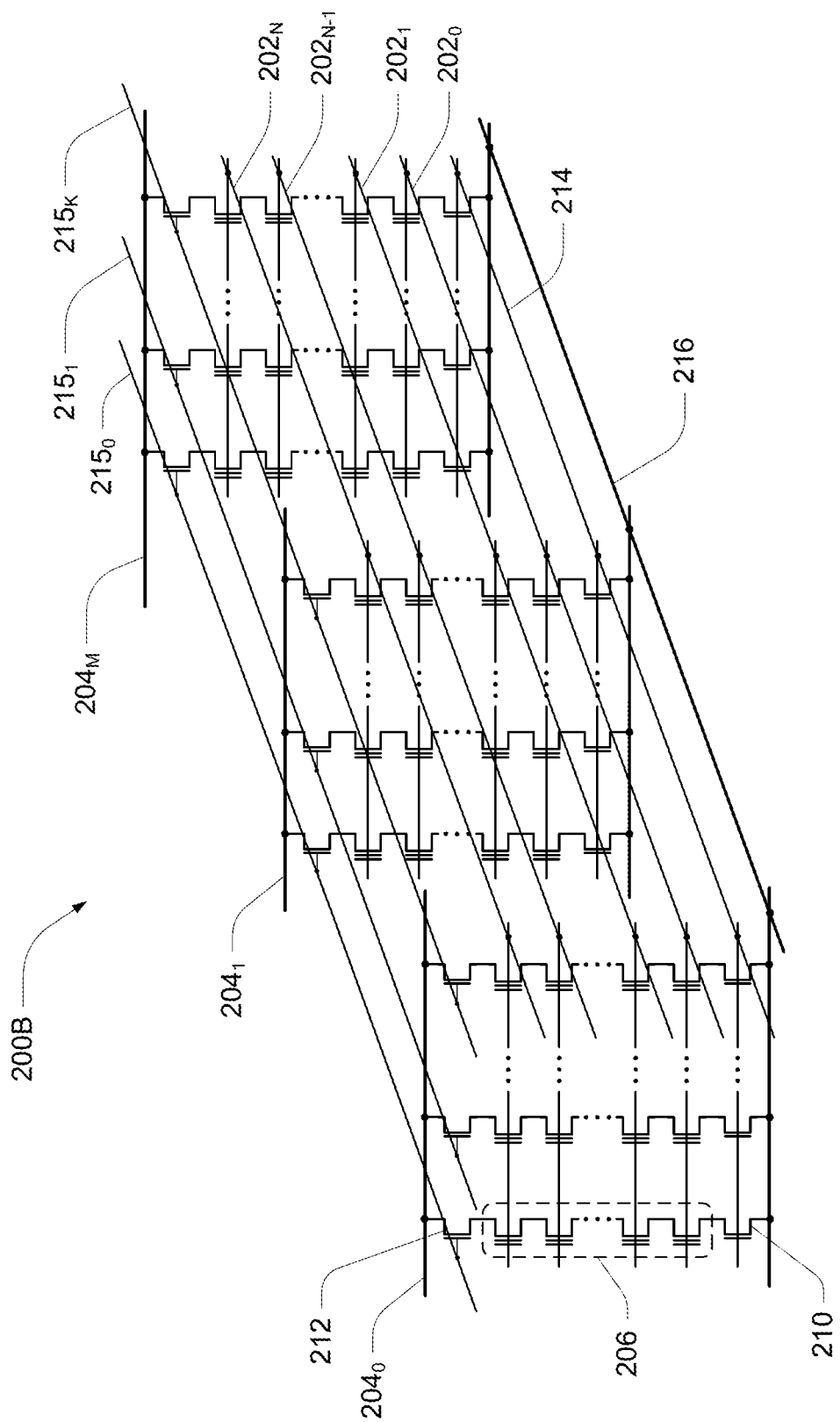

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Various embodiments utilize multi-step programming pulses of a programming operation to program selected memory cells to respective intended data states, wherein a subset of those memory cells might be programmed during one step, and another subset (e.g., mutually exclusive subset) of those memory cells might be programmed during a different step. The steps of a multi-step programming pulse have different voltage levels. The subset of memory cells programmed during a higher (e.g., highest) step of the multi-step programming pulse might be memory cells deemed to be farther from their intended data state (e.g., as measured in volts) than are memory cells of the other subset of memory cells. Accordingly, a verify operation might seek to determine a relative distance from a respective target threshold voltage for each memory cell that is not yet deemed to have a threshold voltage corresponding to its intended data state.

Figure 3:
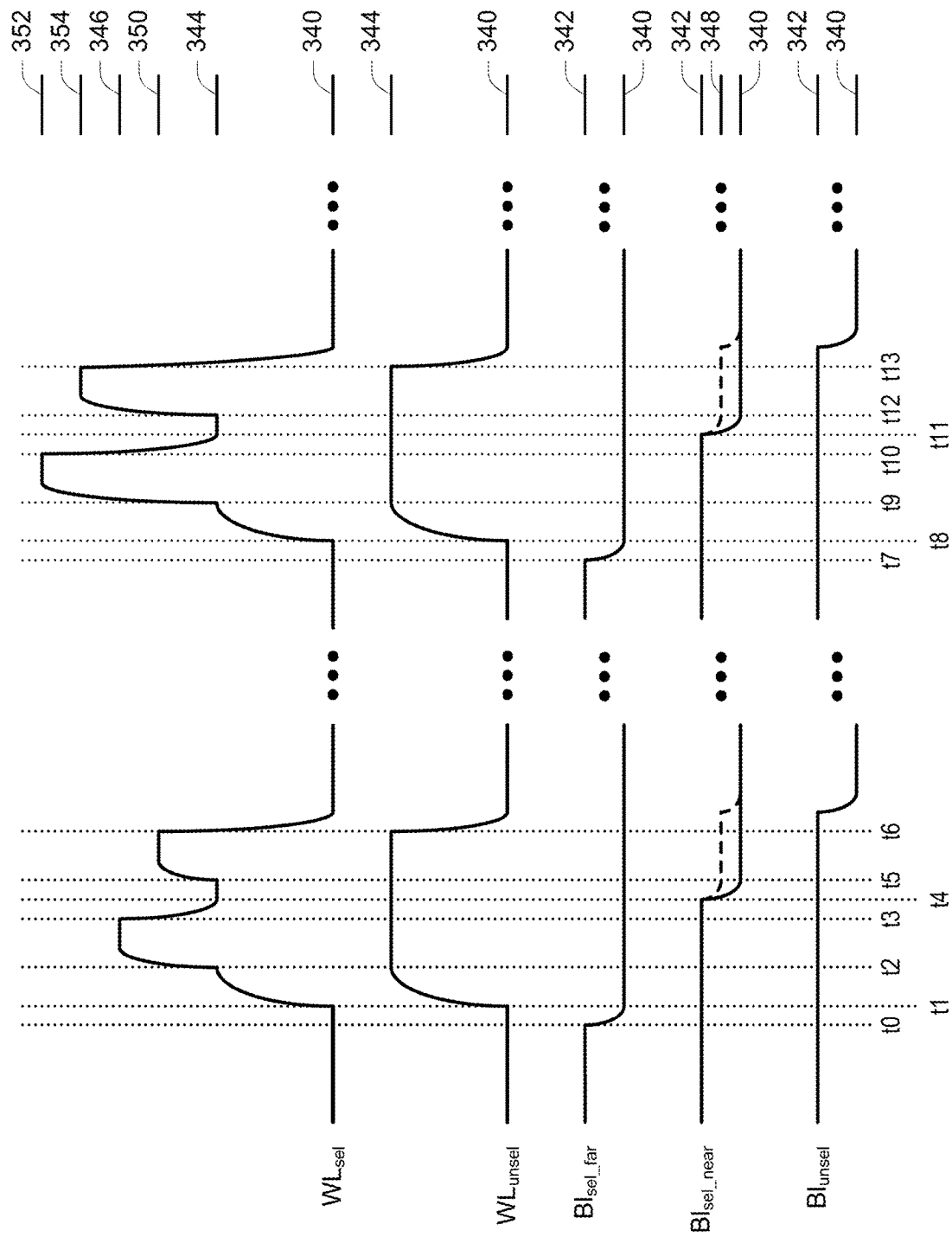
FIG. 3 is a timing diagram generally depicting waveforms of various nodes of an array of memory cells at various stages of a programming operation in accordance with embodiments.

FIG. 3 is a timing diagram generally depicting waveforms of various nodes of an array of memory cells at various stages of a programming operation in accordance with embodiments using multi-step programming pulses. In FIG. 3, the waveform $WL_{sel}$ might correspond to the access line (e.g., a selected access line) connected to a memory cell selected for programming during the programming operation, while the waveform $WL_{unsel}$ might correspond to a different access line (e.g., an unselected access line) of a string of series-connected memory cells containing a memory cell selected for programming during the programming operation.

The waveform $BL_{sel\_far}$ might correspond to a data line (e.g., a selected data line) selectively connected to a memory cell selected for programming during the programming operation and deemed to have a threshold voltage lower than (or equal to) an intermediate verify voltage for its respective intended data state, while the waveform $BL_{sel\_near}$ might correspond to a data line selectively connected to a memory cell selected for programming during the programming operation and deemed to have a threshold voltage lower than (or equal to) a target verify voltage for its respective intended data state, and higher than an intermediate verify voltage for its respective intended data state. The waveform $BL_{unsel}$ might correspond to a data line selectively connected to a memory cell selected for programming during the programming operation, but deemed to have a threshold voltage higher than a target verify voltage for its respective intended data state. The waveform $BL_{unsel}$ might further correspond to data lines selectively connected to memory cells connected to the selected access line that are not selected for programming during the programming operation.

Consider the example where the memory cell $208_{x+1}$ of the NAND string $206_0$ of FIG. 2A is selected for programming and deemed to have a threshold voltage lower than (or equal to) an intermediate verify voltage for its intended data state, and the memory cell $208_{x+1}$ of the NAND string $206_1$ of FIG. 2A is selected for programming and deemed to have a threshold voltage lower than (or equal to) a target verify voltage for its intended data state, and higher than an intermediate verify voltage for its intended data state. In this example, the waveform $WL_{sel}$ might represent a voltage level to be applied to the access line $202_{x+1}$, e.g., a selected access line, while the waveform $WL_{unsel}$ might represent a voltage level to be applied to one or more (including all) of the access lines $202_0$-$202_x$ and $202_{x+2}$-$202_N$, e.g., unselected access lines. The waveform $BL_{sel\_far}$ might represent a voltage level to be applied to the data line $204_0$, e.g., a selected data line, and might further represent voltage levels to be applied to other data lines 204 (e.g., other selected data lines) selectively connected to memory cells deemed to have respective threshold voltages lower than (or equal to) an intermediate verify voltage for their respective intended data states. The waveform $BL_{sel\_near}$ might represent a voltage level to be applied to the data line $204_1$, e.g., a selected data line, and might further represent voltage levels to be applied to other data lines 204 (e.g., other selected data lines) selectively connected to memory cells deemed to have respective threshold voltages lower than (or equal to) a target verify voltage for their respective intended data states, and higher than an intermediate verify voltage for their respective intended data states. The waveform $BL_{unsel}$ might represent a voltage level to be applied to a data line 204, e.g., an unselected data line, that is selectively connected to a memory cell connected to the selected access line $202_{x+1}$ that is not selected for programming during the programming operation, or that has reached a threshold voltage higher than a target verify voltage for its intended data state.

Prior to time t0, the waveforms $WL_{sel}$ and $WL_{unsel}$ might have an initial voltage level 340, such as a reference potential, ground or $V_{SS}$. The waveforms $BL_{sel\_far}$, $BL_{sel\_near}$ and $BL_{unsel}$ might each have an initial voltage level 342 acting as an inhibit voltage, such as Vcc. The voltage level 342 might be configured to inhibit programming of a memory cell connected to the selected access line 202 and selectively connected to a data line 204 receiving the voltage level 342. Further at time t0, the waveform $BL_{sel\_far}$ might be decreased to the voltage level 340, which might correspond to an enable voltage configured to enable programming of a memory cell connected to the selected access line 202 and selectively connected to a data line 204 receiving the voltage level 340.

At time t1, the waveforms $WL_{sel}$ and $WL_{unsel}$ might be increased to a voltage level 344. The voltage level 344 might correspond to a pass voltage configured to activate a memory cell connected to an access line 202 regardless of its data state. At time t2, the waveform $WL_{sel}$ might be increased to a voltage level 346. The voltage level 346 might correspond to a programming voltage configured to cause a change (e.g., increase) in a threshold voltage of a memory cell connected to the selected access line and selectively connected to a selected data line receiving an enable voltage. At time t3, the waveform $WL_{sel}$ might be returned to the voltage level 344 or some other voltage level less than the voltage level 346, which might include the voltage level 350. The period of time between time t2 and time t3 for the waveform $WL_{sel}$ will be referred to herein as a step (e.g., a first step) of a multi-step programming pulse (e.g., a particular multi-step programming pulse) as the voltage level is intentionally held for some finite period of time at a particular value (e.g., voltage level 346) that is higher than a voltage level of an unselected access line (e.g., voltage level 344).

At time t4, the waveform $BL_{sel\_near}$ might be decreased to the voltage level 340, which might correspond to an enable voltage configured to enable programming (e.g., fully enable programming) of a memory cell connected to the selected access line 202 and selectively connected to a data line 204 receiving the voltage level 340. For some data lines and/or embodiments, the waveform $BL_{sel\_near}$ alternatively might be decreased to some voltage level 348 lower than the voltage level 342, but higher than the voltage level 340. While a memory cell connected to the selected access line 202 and selectively connected to a data line 204 receiving the voltage level 348 will be deemed enabled for programming, its programming might be slowed down relative to a memory cell connected to the selected access line 202 and selectively connected to a data line 204 receiving the voltage level 340. The use of different voltages levels on data lines to be enabled for programming might occur in programming schemes known as selective slow programming convergence (SSPC), where memory cells nearer to their respective intended data states are programmed more slowly (e.g., partially enabled for programming) compared to memory cells farther from their respective intended data states (e.g., fully enabled for programming) while receiving a same voltage level at their respective control gates. While only one voltage level 348 for partially enabling programming is depicted in FIG. 3, different target data states might utilize different intermediate voltage levels between the voltage level 340 and the voltage level 342.

At time t5, the waveform $WL_{sel}$ might be increased to the voltage level 350. For some embodiments, the waveform $WL_{sel}$ might be decreased from the voltage level 346 to the voltage level 350 at time t3, such that no increase at time t5 would occur. The voltage level 350 might be lower than the voltage level 346. At time t6, the waveform $WL_{sel}$ might be returned to the voltage level 340 or some other voltage level less than the voltage level 344. The waveform $WL_{unsel}$ might also be returned to the voltage level 340 or some other voltage level less than the voltage level 344. At some time after time t6, the waveforms $BL_{sel\_near}$ and $BL_{unsel}$ might also be returned to the voltage level 340. The period of time between time t5 and time t6 for the waveform $WL_{sel}$ will be referred to herein as a step (e.g., a second step) of the particular multi-step programming pulse as the voltage level is intentionally held for some finite period of time at a particular value (e.g., voltage level 350) that is higher than a voltage level of an unselected access line (e.g., voltage level 344).

Between times t6 and t7, a verify operation might be performed to determine which memory cells might be deemed to have reached their respective intended data states, e.g., memory cells that are deemed to have respective threshold voltages higher than a target verify voltage corresponding to their respective intended data states. The verify operation might further determine relative nearness to their respective intended data states for those memory cells that are not deemed to have reached their respective intended data states. This relative nearness might be used to determine which memory cells should be enabled during the first step of a next subsequent multi-step programming pulse, and which memory cells should be enabled during the second step of the next subsequent multi-step programming pulse. For embodiments utilizing SSPC programming, this relative nearness further might be used to determine which memory cells should be fully enabled or partially enabled during the second step of the next subsequent multi-step programming pulse. Verify operations will be described with reference to FIGS. 4-7. There may be no intervening programming pulses between the times t6 and t7.

Prior to time t7, the waveforms $WL_{sel}$ and $WL_{unsel}$ might have the initial voltage level 340, such as a reference potential, ground or $V_{SS}$. The waveforms $BL_{sel\_far}$, $BL_{sel\_near}$ and $BL_{unsel}$ might each have the initial voltage level 342 acting as an inhibit voltage, such as Vcc. Further at time t7, the waveform $BL_{sel\_far}$ might be decreased to the voltage level 340, which might correspond to an enable voltage configured to enable programming of a memory cell connected to the selected access line 202 and selectively connected to a data line 204 receiving the voltage level 340.

At time t8, the waveforms $WL_{sel}$ and $WL_{unsel}$ might be increased to the voltage level 344. At time t9, the waveform $WL_{sel}$ might be increased to a voltage level 352. The voltage level 352 might correspond to a programming voltage configured to cause a change (e.g., increase) in a threshold voltage of a memory cell connected to the selected access line and selectively connected to a selected data line receiving an enable voltage. The voltage level 352 might be higher than the voltage level 346. At time t10, the waveform $WL_{sel}$ might be returned to the voltage level 344 or some other voltage level less than the voltage level 352, which might include the voltage level 354. The period of time between time t9 and time t10 for the waveform $WL_{sel}$ will be referred to herein as a step (e.g., a first step) of a multi-step programming pulse (e.g., a next subsequent multi-step programming pulse) as the voltage level is intentionally held for some finite period of time at a particular value (e.g., voltage level 352) that is higher than a voltage level of an unselected access line (e.g., voltage level 344).

At time t11, the waveform $BL_{sel\_near}$ might be decreased to the voltage level 340, which might correspond to an enable voltage configured to enable programming (e.g., fully enable programming) of a memory cell connected to the selected access line 202 and selectively connected to a data line 204 receiving the voltage level 340. For some data lines and/or embodiments, the waveform $BL_{sel\_near}$ alternatively might be decreased to some voltage level 348 lower than the voltage level 342, but higher than the voltage level 340.

At time t12, the waveform $WL_{sel}$ might be increased to the voltage level 354. For some embodiments, the waveform $WL_{sel}$ might be decreased from the voltage level 352 to the voltage level 354 at time t10, such that no increase at time t12 would occur. The voltage level 354 might be lower than the voltage level 352, and the voltage level 354 further might be higher than the voltage level 346. At time t13, the waveform $WL_{sel}$ might be returned to the voltage level 340 or some other voltage level less than the voltage level 344. The waveform $WL_{unsel}$ might also be returned to the voltage level 340 or some other voltage level less than the voltage level 344. At some time after time t13, the waveforms $BL_{sel\_near}$ and $BL_{unsel}$ might also be returned to the voltage level 340. The period of time between time t12 and time t13 for the waveform $WL_{sel}$ will be referred to herein as a step (e.g., a second step) of the next subsequent multi-step programming pulse as the voltage level is intentionally held for some finite period of time at a particular value (e.g., voltage level 354) that is higher than a voltage level of an unselected access line (e.g., voltage level 344). Each step of the next subsequent multi-step programming pulse might be higher than any step of the particular multi-step programming pulse.

It is noted that the data lines corresponding to the waveform $BL_{sel\_far}$ during the time period from t0 to t6 may include different data lines than those data lines corresponding to the waveform $BL_{sel\_far}$ during the time period from t7 to t13, the data lines corresponding to the waveform $BL_{sel\_near}$ during the time period from t0 to t6 may include different data lines than those data lines corresponding to the waveform $BL_{sel\_near}$ during the time period from t7 to t13, and the data lines corresponding to the waveform $BL_{unsel}$ during the time period from t0 to t6 may include different data lines than those data lines corresponding to the waveform $BL_{unsel}$ during the time period from t7 to t13. For example, a data line corresponding to a memory cell deemed to be farther from its intended data state prior to applying the particular multi-step programming pulse, and deemed to have its intended data state after applying the particular multi-step programming pulse, might be represented by the waveform $BL_{sel\_far}$ during the time period from t0 to t6, and might be represented by the waveform $BL_{unsel}$ during the time period from t7 to t13. Similarly, a data line corresponding to a memory cell deemed to be farther from its intended data state prior to applying the particular multi-step programming pulse, and deemed to be nearer to its intended data state after applying the particular multi-step programming pulse, might be represented by the waveform $BL_{sel\_far}$ during the time period from t0 to t6, and might be represented by the waveform $BL_{sel\_near}$ during the time period from t7 to t13.

After time t13, another verify operation might be performed to determine which memory cells might be deemed to have reached their respective intended data states, e.g., memory cells that are deemed to have respective threshold voltages higher than a target verify voltage corresponding to their respective intended data states. The verify operation might further determine relative nearness to their respective intended data states for those memory cells that are not deemed to have reached their respective intended data states. This relative nearness might be used to determine which memory cells should be enabled during the first step of a following next subsequent multi-step programming pulse, and which memory cells should be enabled during the second step of the following next subsequent multi-step programming pulse. For embodiments utilizing SSPC programming, this relative nearness further might be used to determine which memory cells should be fully enabled or partially enabled during the second step of the following next subsequent multi-step programming pulse.

The multi-step programming pulse occurring between times t1 and t6, e.g., a particular multi-step programming pulse, may be a second or later programming pulse of a programming operation. An initial programming pulse of the programming operation may not be a multi-step programming pulse. For example, data lines selectively connected to each memory cell selected for programming might receive the enable voltage to be enabled for programming during the initial programming pulse similar to that shown for the waveform $BL_{sel\_far}$ of FIG. 3, but without regard to how near they are to their respective intended data states. The selected and unselected access lines might be increased from the voltage level 340 to the voltage level 344, and unselected data lines might be brought to the voltage level 342. The selected access line might then be increased to some initial programming voltage configured to change (e.g., increase) a threshold voltage of at least one memory cell selected for programming, and then returned to the voltage level 340 along with the unselected access lines. Each subsequent programming pulse of the programming operating might be a multi-step programming pulse as described with reference to FIG. 3. The initial programming voltage might be lower than (or equal to) the voltage level 350, even if the multi-step programming pulse occurring from times t1 to t6 of FIG. 3 is a next subsequent programming pulse from the initial programming pulse.

For some embodiments, a voltage difference between the voltage level 346 and the voltage level 350 has a particular value for the particular multi-step programming pulse occurring between times t1 and t6. For example, the particular value might be 500 mV. In addition, a voltage difference between the voltage level 352 and the voltage level 354 might be substantially equal to (e.g., equal to) the particular value for the next subsequent multi-step programming pulse occurring between times t8 and t13. A voltage difference between the voltage level 352 and the voltage level 346 might be substantially equal to (e.g., equal to) two times the particular value, and a voltage difference between the voltage level 354 and the voltage level 350 might be substantially equal to (e.g., equal to) two times the particular value. A voltage difference between the voltage level 354 and the voltage level 346 might be substantially equal to (e.g., equal to) the particular value. These relationships might hold true for any multi-step programming pulse of the programming operation and its next subsequent multi-step programming pulse. A multi-step programming pulse is a next subsequent programming pulse to a prior multi-step programming pulse if there are no intervening programming pulses between the two, although an intervening verify operation might be performed.

In the foregoing description of FIG. 3, a step of a multi-step programming pulse has been defined to involve intentionally holding a voltage level applied to a selected access line for some finite period of time at a value that is higher than a voltage level of an unselected access line. As it is recognized that using a digital-to-analog (DAC) converter and a clocked counter to develop an increasing or decreasing voltage level can result in a series of steps in the resulting voltage curve, the steps of the multi-step programming pulse are further defined to be at least an order of magnitude longer than any steps resulting from the use of such a DAC converter and clocked counter, or other similar mechanism, to increase or decrease the voltage levels of the multi-step programming pulse from one to another of the voltage levels 344, 346, 350, 352 and 354 as described with reference to FIG. 3. Additionally, the phrase "substantially equal" as used herein recognizes that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if intended values are intended to be equal, those values are substantially equal regardless of their resulting values.

As discussed with reference to FIG. 3, a verify operation might be performed between adjacent multi-step programming pulses to determine whether memory cells have reached their intended data states, and whether memory cells may be deemed to be nearer to, or farther from, their intended data states in a relative sense. Sense circuits are typically utilized in memory devices to facilitate performing a sense (e.g., read and/or verify) operation on each of one or more selected (e.g., target) memory cells in the memory device.

Figure 4:
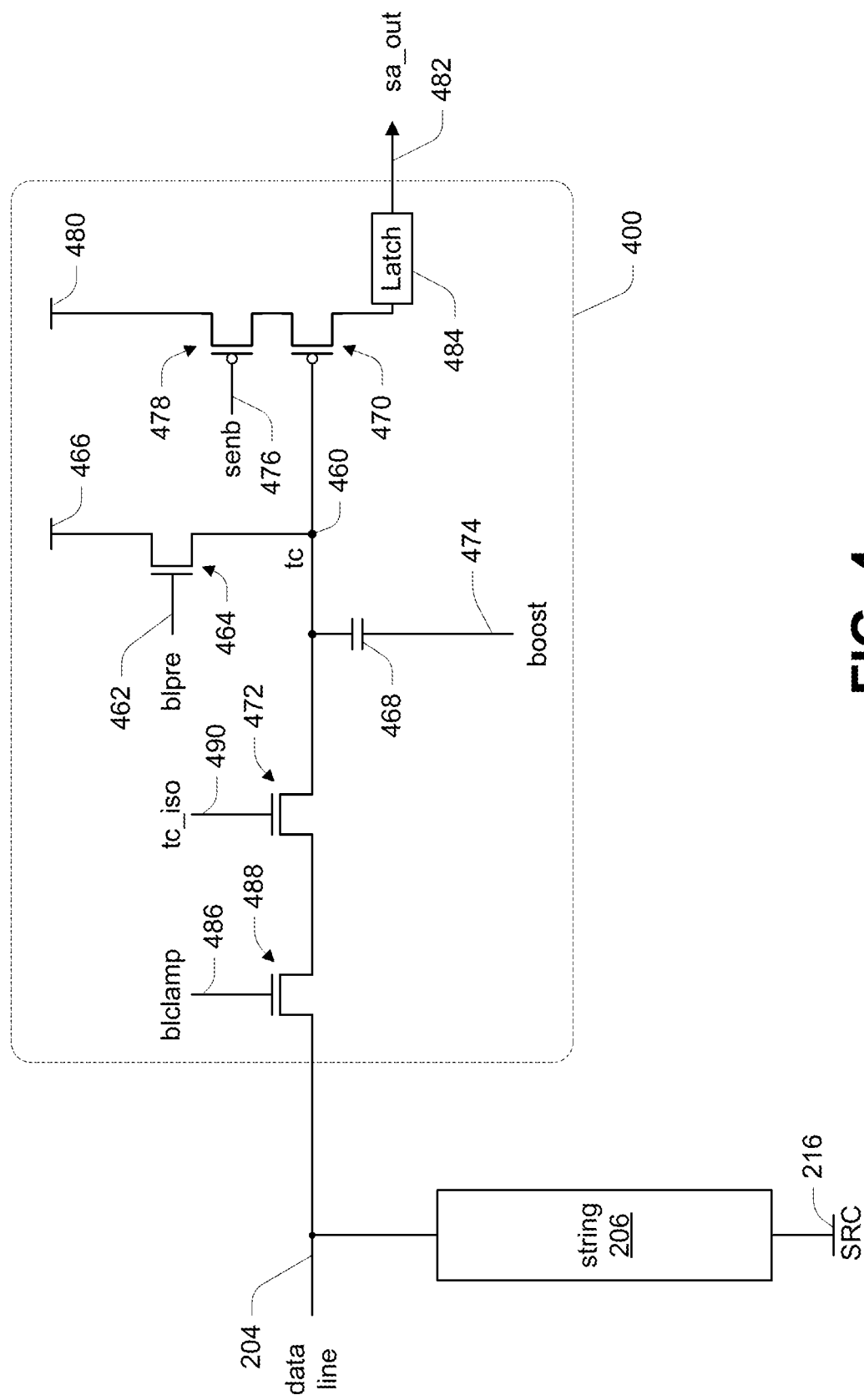
FIG. 4 is a schematic of a sense circuit as might be used with embodiments.

FIG. 4 is a schematic of a sense circuit 400 as might be used with embodiments. Sense circuit 400 is shown connected to a particular NAND string 206 by a particular data line 204, such as shown in more detail in FIG. 2A, for example. Note that select transistors 210 and 212 selectively connecting the NAND string 206 to the source 216 and data line 204, respectively, are not shown in FIG. 4. While the discussion is directed to use of the sense circuit 400 with a NAND string 206, other memory structures and architectures are suitable for use with sense circuit 400 where a current path can be selectively created from the data line 204 to the source 216 dependent upon a data state of a memory cell selected for sensing.

As part of a sense operation, e.g., a precharge portion, the sense circuit 400 may precharge a sense node (e.g., tc node) 460 by activating a precharge transistor (e.g., n-type field effect transistor, or nFET) 464 by biasing (e.g., driving) the signal line 462 to a particular voltage level (e.g., a voltage level of control signal blpre) sufficient to activate the transistor 464. Control signals of the sense circuit 400 may be provided by the internal controller (e.g., control logic 116) of the memory device 100. Such control signals (e.g., both voltage levels and timing) are defined by the sense operation and are distinguished from signals generated in response to performing the sense operation (e.g., the output signal sa_out or a voltage level generated on the sense node 460).

Transistor 464 is connected between a voltage node 466 and the sense node 460. Voltage node 466 might be configured to receive a supply voltage, e.g., Vcc. For some embodiments, voltage node 466 may be a variable voltage node. The capacitance 468 shown coupled to the sense node 460 may be representative of the capacitance at the sense node 460 and additional circuitry connected to it, e.g., transistors 464, 470 and 472. Voltage node 474 (e.g., a variable voltage node) is configured to apply a voltage level to the capacitance 468 which may induce a change in voltage level on the sense node 460, for example, to boost the sense node 460 to a higher voltage level, such as through capacitive coupling.

Additional transistors of the sense circuit facilitate sensing of a voltage level on the sense node 460. For example, the control gate of a sense transistor (e.g., p-type field effect transistor, or pFET) 470 is shown connected to the sense node 460. Thus, sense transistor 470 is configured to be responsive to a voltage level present on the sense node 460. Signal line 476 connected to the gate of a sense enable transistor (e.g., pFET) 478 and configured to receive control signal senb facilitates isolating the sense transistor 470 from the voltage node 480, which may be configured to receive a supply voltage, e.g., Vcc. The sense circuit output (e.g., sa_out) line 482 might be connected to additional circuitry (not shown in FIG. 4) of the memory device configured to respond to the sense circuit 400 as part of a sensing operation. For example, the sense circuit 400 may be a component of the data register 120 of FIG. 1 and its output sa_out may be provided as an input to the cache register 118 for output of the sensed data state from the memory device 100. The output signal sa_out on output line 482 might comprise a signal generated by a latch (e.g., latch circuit) 484 which is representative of a logic level, such as a logic 'high' (e.g., represented by Vcc) or logic 'low' (e.g., represented by $V_{SS}$) level indicative of a sensed data state of a selected memory cell of NAND string 206, for example. Latch 484 may be configured as a pair of cross-coupled inverters, for example. For some embodiments, latch 484 might be eliminated, connecting the output line 482 to the sense transistor 470.

During a precharge portion of a sense operation, the gate of transistor 464 is biased by a voltage level (e.g., of control signal blpre) on signal line 462 to precharge the sense node 460 by injecting a precharge current into the sense node 460. An additional voltage level (e.g., of control signal blclamp) may be applied to signal line 486 to activate transistor (e.g., nFET) 488, and a further voltage level (e.g., of control signal tc_iso) may be applied to signal line 490 to activate transistor (e.g., nFET) 472. Activating transistors 464, 472 and 488 serves to connect data line 204 to the voltage node 466, thereby precharging the sense node 460 and the data line 204.

Following the precharging of the sense node 460 and the data line 204, a second portion of the sense operation is performed to detect whether or not the precharged data line 204 and sense node 460 is discharged during the sense operation, thereby determining the data state of the memory cell selected for sensing. In general, following the precharging of the sense node 460 and the data line 204, the sense node 460 may be isolated from the data line 204, such as by deactivating the transistor 488 and/or deactivating the transistor 472. The data line 204 is then selectively connected to the source 216 depending upon whether the memory cell selected for sensing is activated or deactivated in response to a sense voltage applied to its control gate. After the data line 204 is given an opportunity to discharge if current is flowing through the NAND string 206, the sense node 460 may again be connected to the data line 204 by activating the transistors 472 and 488. If a voltage level of the data line 204 is lower than the precharge voltage level due to current flow through the NAND string 206, the voltage level of the sense node 460 will likewise experience a drop. If the voltage level of the data line 204 remains at the precharge voltage level, such as when the memory cell selected for sensing remains deactivated, the voltage level of the sense node 460 may remain at its precharge (or boosted) voltage level. With the transistor 478 activated, and the voltage level of the sense node 460 applied to the control gate of the sense transistor 470, the voltage node 480 may be selectively connected to the latch 484 depending upon a voltage level of the sense node 460. The latch 484 may have a particular logic level (e.g., logic high) prior to sensing. If the voltage level of the voltage node 480 is applied to the input of the latch 484 upon activation of the transistor 478, its logic level may change, e.g., from a logic high level to a logic low level, and if the voltage node 480 remains isolated from the input of the latch 484 upon activation of the transistor 478, its logic level may remain at the particular logic level.

Various embodiments may utilize boosting and deboosting of the sense node 460 during the sense operation. Boosting (e.g., capacitively coupling a boost voltage level to) and deboosting (e.g., capacitively decoupling a deboost voltage level from) the sense node 460 might be used, for example, to facilitate a higher develop overhead. By boosting the sense node 460 prior to the sense node develop time, the voltage level of the sense node 460 can be allowed to develop longer without prematurely indicating current flow of the data line 204. Subsequent deboosting of the sense node 460 after isolation from the NAND string 206 from the data line 204 permits the voltage level of the sense node 460 to drop below the trip point (e.g., threshold voltage) of the sense transistor 470 to indicate that current flow was detected.

The trip point of the sense circuit 400 may generally be dependent upon the threshold voltage of the sense transistor 470. The sense circuit 400 is typically configured to have a trip point (e.g., sense threshold level) close to the precharge voltage level that may be established on the sense node 460 prior to sensing the selected memory cell. The trip point might be a particular voltage level on the sense node 460 wherein the sense circuit 400 outputs a first logic level indicative of a first data state of a sensed selected memory cell when the voltage level of the sense node 460 is equal to or above the trip point. The sense circuit 400 might output a second logic level indicative of a second data state of the sensed selected memory cell when the voltage level of the sense node 460 is below the trip point, for example.

Figure 5:
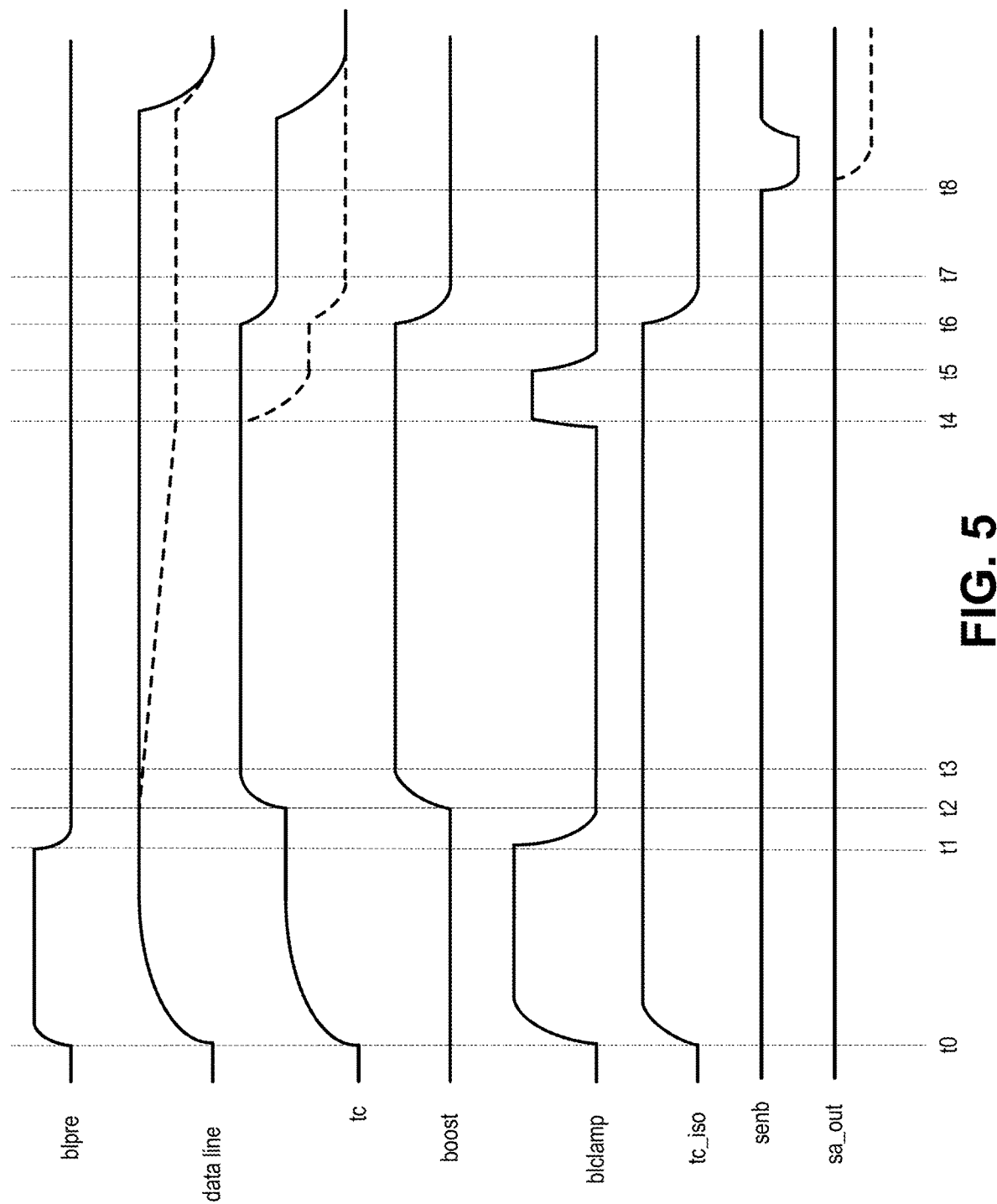
FIG. 5 is a timing diagram generally depicting waveforms of various nodes of a sense circuit such as depicted in FIG. 4 at various stages of a sense operation that might be used with embodiments.
Figure 6:
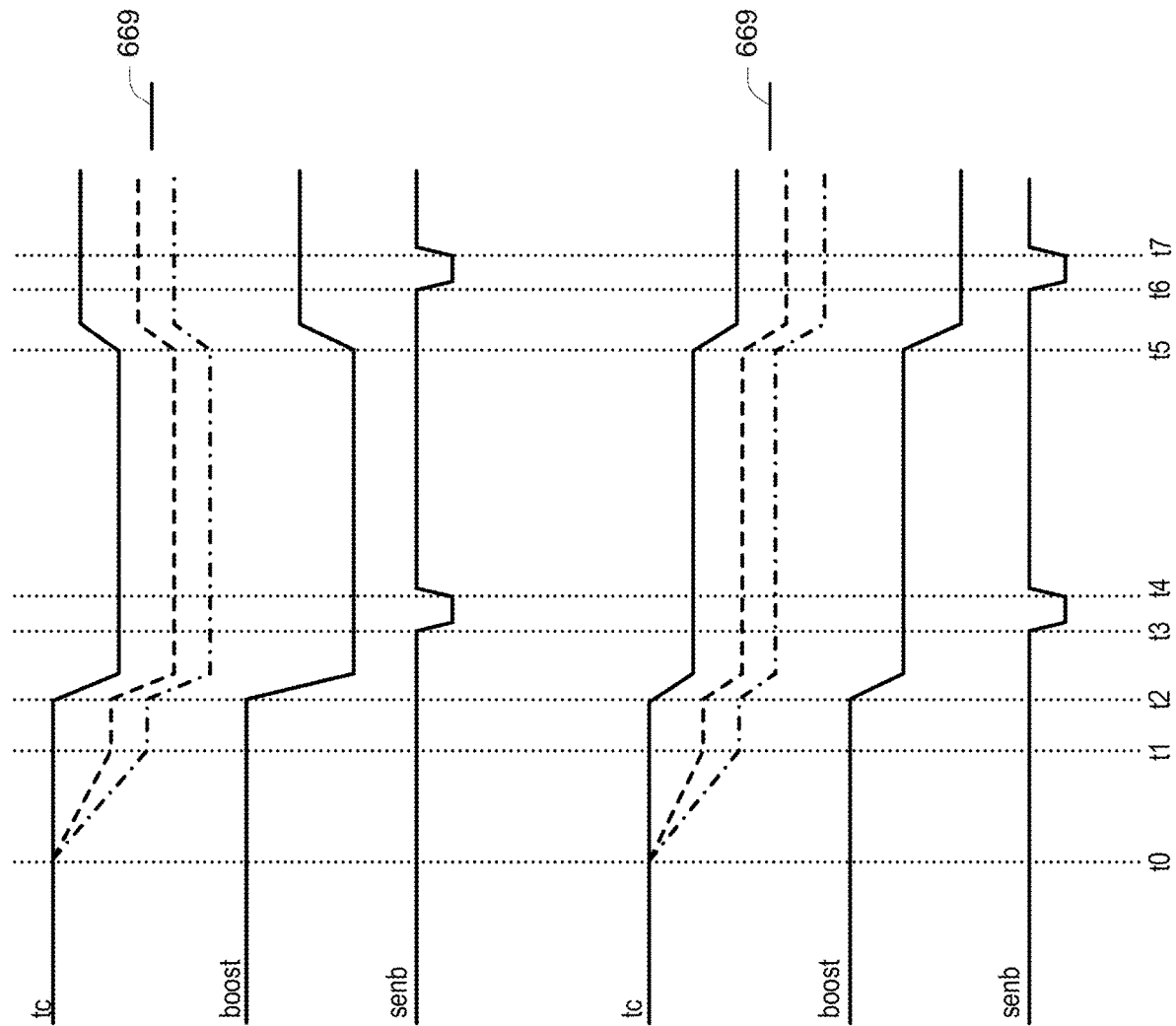
FIGS. 6A-6B are timing diagrams generally depicting waveforms of various nodes of a sense circuit such as depicted in FIG. 4 at various stages of sense operations that might be used with embodiments.

FIG. 5 is a timing diagram generally depicting waveforms of various nodes of a sense circuit such as depicted in FIG. 4 at various stages of a sense (e.g., verify) operation that might be used with embodiments. With regard to FIG. 5, a precharge portion of the sense operation may begin at time t0 by biasing control signals blpre, blclamp and tc_iso to voltage levels sufficient to activate transistors 464, 488 and 472, respectively, thereby connecting the data line 204 and the sense node 460 to the voltage node 466. In response the voltage level tc of the sense node 460 and the voltage level data line of the data line 204 increase. At time t1, the sense node 460 may be isolated from the data line 204 and the voltage node 466, such as by biasing control signals blpre and blclamp to voltage levels sufficient to deactivate the transistors 464 and 488. Note that the control signal tc_iso may remain at the level sufficient to activate the transistor 472 as transistor 488 provides isolation from the data line 204.

Between time t1 and time t4, the data line 204 is selectively connected to the source 216 depending upon whether the memory cell selected for sensing is activated or not in response to the sense voltage (e.g., a verify voltage). If the selected memory cell is activated, the data line 204 may decrease in voltage as current flows through the NAND string 206, such as depicted in dashed line, and if the memory cell is deactivated, the data line 204 may remain at the precharge voltage level, such as depicted in solid line. At time t2, the boost voltage is applied at voltage node 474, thereby boosting the voltage level of the sense node 460 to a boosted voltage level (e.g., higher than the precharge voltage level) at time t3. At time t4, the sense node 460 is again connected to the data line 204, such as by biasing control signal blpre to a voltage level sufficient to activate the transistor 488, and, where the data line 204 has discharged, or is discharging, the voltage level of the sense node 460 will decrease such as depicted in dashed line tc. At time t5, the sense node 460 is isolated from the data line 204, such as by biasing control signals blclamp and/or tc_iso to voltage levels sufficient to deactivate one or both transistors 472 and 488.

At time t6, after the sense node 460 has been connected to, and subsequently isolated from, the data line 204, the sense node 460 is deboosted by some particular voltage level, such as by removing or reducing a voltage level applied to the voltage node 474, thereby reaching a deboosted voltage level at time t7. At time t8, the sense transistor 470 is connected to the voltage node 480 by biasing the control signal senb to a voltage level sufficient to activate the transistor 478. If the sense transistor 470 is activated, the voltage node 480 is connected to the latch 484, thereby changing the logic level of the output signal sa_out, and if the sense transistor 470 is deactivated, the voltage node 480 remains isolated from the latch 484, allowing the logic level of the output signal sa_out to remain unchanged. While this example describes a change in logic level of the output signal sa_out (e.g., a change in the logic level of the latch 484) from a logic high level to a logic low level as indicating the voltage level of the sense node 460 being below the trip point of the sense transistor 470, a transition from a logic low level to a logic high level could alternatively be provided with appropriate changes in the latch 484, e.g., by providing an additional inverter to the output of the latch.

For some embodiments, a sense operation such as described with reference to FIG. 5 might be performed while applying a target verify voltage (e.g., from time t2 to time t4) to the control gate of the selected memory cell of the NAND string 206 corresponding to the intended data state of the selected memory cell, i.e., a voltage level intended to deactivate the selected memory cell if it has exceeded a threshold voltage corresponding to its intended data state, and to activate the selected memory cell if its threshold voltage is lower than (or equal to) the value corresponding to its intended data state. During this time, pass voltages (e.g., voltages configured to activate a memory cell regardless of its data state) might be applied to control gates of the remaining memory cells of the NAND string 206.

An additional sense operation might be performed while applying an intermediate, e.g., lower, verify voltage to the control gate of the selected memory cell in a similar manner. If the selected memory cell is deemed to be deactivated while applying the target verify voltage, it might be deemed to have its intended data state, and can be inhibited from further programming. If the selected memory cell is deemed to be activated while applying the target verify voltage, and the selected memory cell is deemed to be activated while applying the intermediate verify voltage, it might be deemed to be farther from its intended data state, and can be enabled for further programming during a high step of the next subsequent multi-step programming pulse. And if the selected memory cell is deemed to be activated while applying the target verify voltage, but the selected memory cell is deemed to be deactivated while applying the intermediate verify voltage, it might be deemed to be nearer to its intended data state, and can be inhibited from further programming during a high step of the next subsequent multi-step programming pulse, and enabled for further programming during a low step of the next subsequent multi-step programming pulse. It is noted that each data state of a plurality of possible data states for the memory cells of a programming operation might have a respective target verify voltage and a respective intermediate verify voltage corresponding to its target threshold voltage range. For some embodiments, the intermediate verify voltage for a given data state may be on the order of 500 mV lower than the target verify voltage for that data state. For some embodiments, a voltage difference between the target verify voltage and the intermediate verify voltage is substantially equal to (e.g., equal to) the voltage difference between the voltage level 346 and the voltage level 350 of FIG. 3.

For embodiments incorporating SSPC programming, a further sense operation might be performed while applying a different verify voltage to the control gate of the selected memory cell in a similar manner, where the different verify voltage is lower than the target verify voltage and higher than the intermediate verify voltage. The different verify voltage might be referred to as a secondary intermediate verify voltage. If the selected memory cell is deemed to be deactivated while applying the target verify voltage, it might be deemed to have its intended data state, and can be inhibited from further programming. If the selected memory cell is deemed to be activated while applying the target verify voltage, and the selected memory cell is deemed to be activated while applying the intermediate verify voltage, it might be deemed to be farther from its intended data state, and can be enabled for further programming during a high step of the next subsequent multi-step programming pulse. If the selected memory cell is deemed to be activated while applying the target verify voltage and while applying the secondary intermediate verify voltage, but the selected memory cell is deemed to be deactivated while applying the intermediate verify voltage, it might be deemed to be nearer to its intended data state, and can be inhibited from further programming during a high step of the next subsequent multi-step programming pulse, and fully enabled for further programming during a low step of the next subsequent multi-step programming pulse. And if the selected memory cell is deemed to be activated while applying the target verify voltage, and deactivated while applying the secondary intermediate verify voltage and while applying the intermediate verify voltage, it might be deemed to be even nearer to its intended data state, and can be inhibited from further programming during a high step of the next subsequent multi-step programming pulse, and partially enabled for further programming during a low step of the next subsequent multi-step programming pulse. It is noted that each data state of a plurality of possible data states for the memory cells of a programming operation might have a respective target verify voltage, a respective secondary intermediate verify voltage, and a respective intermediate verify voltage corresponding to its target threshold voltage range.

As an alternative to performing multiple sense operations with separate precharge portions to detect whether a memory cell is deemed to be farther from its intended data state, to be nearer to its intended data state, or to have its intended data state, a single sense operation could be performed, and different levels of boosting could be used to make similar determinations. Specifically, boosting and deboosting the sense node 460 might be used to alter the detection level of the sense circuit, e.g., to detect different expected threshold voltages during a single sense operation. FIGS. 6A-6B are timing diagrams generally depicting waveforms of various nodes of a sense circuit such as depicted in FIG. 4 at various stages of sense operations that might be used with such embodiments.

In FIG. 6A, the threshold voltage distributions 661 and 663 might represent threshold voltage distributions of memory cells of adjacent data states of a programming operation. The line 665 might represent the target verify voltage corresponding to the intended data state, and the line 667 might represent the corresponding intermediate verify voltage for that data state. Memory cells deactivated in response to the target verify voltage 665 might be deemed to have that intended data state, memory cells deactivated in response to the intermediate verify voltage 667 (e.g., and activated in response to the target verify voltage 665) might be deemed to be near that intended data state, and memory cells activated in response to the intermediate verify voltage 667 (e.g., and activated in response to the target verify voltage 665) might be deemed to be far from that intended data state.

The times t0, t1, t2 and t3 of FIG. 6A might correspond to the times t4, t5, t6 and t8, respectively, of FIG. 5. Accordingly, time t0 of FIG. 6A might represent the connection of the sense node tc to the data line 204, and time t1 might represent the subsequent isolation of the sense node tc from the data line 204 after its selective discharge. The solid line for the sense node tc might represent the response at the sense node tc for a memory cell having a threshold voltage higher than the target verify voltage 665, the dashed line for the sense node tc might represent the response at the sense node tc for a memory cell having a threshold voltage between the target verify voltage 665 and the intermediate verify voltage 667, and the dot-dashed line for the sense node tc might represent the response at the sense node tc for a memory cell having a threshold voltage lower than the intermediate verify voltage 667. If a sense operation is performed while applying the target verify voltage 665 to the control gates of these example selected memory cells, a memory cell having a threshold voltage higher than the target verify voltage would be deactivated. In contrast, a memory cell having a threshold voltage between the target verify voltage 665 and the intermediate verify voltage 667, and a memory cell having a threshold voltage lower than the intermediate verify voltage 667, would both be activated, resulting in a discharge of the sense node tc beginning at time t0. However, the memory cell having a threshold voltage lower than the intermediate verify voltage 667 might present a lower resistance path between the source 216 and the sense node tc than the memory cell having a threshold voltage between the target verify voltage 665 and the intermediate verify voltage 667. As such, the sense node tc might discharge more quickly, and to a lower level, for the memory cell having a threshold voltage lower than the intermediate verify voltage 667.

At time t2, the boost voltage level might be reduced. The degree of deboosting at time t2 might be chosen such that the sense node tc for a memory cell having a threshold voltage higher than the target verify voltage 665 would have a voltage level higher than the trip point 669 of the sense transistor 470, while the sense node tc for a memory cell having a threshold voltage lower than (or equal to) the target verify voltage 665 would have a voltage level lower than the trip point 669. At time t3, the sense transistor 470 might be connected to the voltage node 480 by biasing the control signal senb to a voltage level sufficient to activate the transistor 478, and at time t4, the sense transistor 470 might be isolated from the voltage node 480 by biasing the control signal senb to a voltage level insufficient to activate the transistor 478. During the period between time t3 and t4, a state of the sense node tc might be determined to indicate whether or not the memory cell has a threshold voltage higher than the target verify voltage 665. Between time t4 and t5, the latch 484 might be reset.

At time t5, the boost voltage might be increased. The degree of boosting at time t5 might be chosen such that the sense node tc for a memory cell having a threshold voltage higher than the intermediate verify voltage 667 would have a voltage level higher than the trip point 669 of the sense transistor 470, while the sense node tc for a memory cell having a threshold voltage lower than (or equal to) the intermediate verify voltage 665 would have a voltage level lower than the trip point 669. At time t6, the sense transistor 470 might be connected to the voltage node 480 by biasing the control signal senb to a voltage level sufficient to activate the transistor 478, and at time t7, the sense transistor 470 might be isolated from the voltage node 480 by biasing the control signal senb to a voltage level insufficient to activate the transistor 478. During the period between time t6 and t7, a state of the sense node tc might be determined to indicate whether or not the memory cell has a threshold voltage lower than the intermediate verify voltage 667. In this manner, a determination can be made whether the memory cell has exceeded a threshold voltage corresponding to its intended data state, whether the memory cell has a threshold voltage deemed to be near its intended data state, or whether the memory cell has a threshold voltage deemed to be far from its intended data state.

In FIG. 6B, like numbered elements correspond to the description as provided with respect to FIG. 6A. The times t0, t1, t2 and t3 of FIG. 6B might correspond to the times t4, t5, t6 and t8, respectively, of FIG. 5. Accordingly, time t0 of FIG. 6B might represent the connection of the sense node tc to the data line 204, and time t1 might represent the subsequent isolation of the sense node tc from the data line 204 after its selective discharge. The solid line for the sense node tc might represent the response at the sense node tc for a memory cell having a threshold voltage higher than the target verify voltage 665, the dashed line for the sense node tc might represent the response at the sense node tc for a memory cell having a threshold voltage between the target verify voltage 665 and the intermediate verify voltage 667, and the dot-dashed line for the sense node tc might represent the response at the sense node tc for a memory cell having a threshold voltage lower than the intermediate verify voltage 667. If a sense operation is performed while applying the target verify voltage 665 to the control gates of these example selected memory cells, a memory cell having a threshold voltage higher than the target verify voltage would be deactivated. In contrast, a memory cell having a threshold voltage between the target verify voltage 665 and the intermediate verify voltage 667, and a memory cell having a threshold voltage lower than the intermediate verify voltage 667, would both be activated, resulting in a discharge of the sense node tc beginning at time to. However, the memory cell having a threshold voltage lower than the intermediate verify voltage 667 might present a lower resistance path between the source 216 and the sense node tc than the memory cell having a threshold voltage between the target verify voltage 665 and the intermediate verify voltage 667. As such, the sense node tc might discharge more quickly, and to a lower level, for the memory cell having a threshold voltage lower than the intermediate verify voltage 667.

At time t2, the boost voltage level might be reduced. The degree of deboosting at time t2 might be chosen such that the sense node tc for a memory cell having a threshold voltage higher than the target verify voltage 665, and for a memory cell having a threshold voltage lower than (or equal to) the target verify voltage 665 and higher than the intermediate verify voltage 667, would have a voltage level higher than the trip point 669 of the sense transistor 470, and the sense node tc for a memory cell having a threshold voltage lower than (or equal to) the intermediate verify voltage 667 would have a voltage level lower than the trip point 669. At time t3, the sense transistor 470 might be connected to the voltage node 480 by biasing the control signal senb to a voltage level sufficient to activate the transistor 478, and at time t4, the sense transistor 470 might be isolated from the voltage node 480 by biasing the control signal senb to a voltage level insufficient to activate the transistor 478. During the period between time t3 and t4, a state of the sense node tc might be determined to indicate whether or not the memory cell has a threshold voltage lower than (or equal to) the intermediate verify voltage 667. Between time t4 and t5, the latch 484 might be reset.

At time t5, the boost voltage might be further decreased. The degree of deboosting at time t5 might be chosen such that the sense node tc for a memory cell having a threshold voltage lower than (or equal to) the target verify voltage 665 would have a voltage level lower than the trip point 669 of the sense transistor 470, while the sense node tc for a memory cell having a threshold voltage higher than the target verify voltage 665 would have a voltage level higher than the trip point 669. At time t6, the sense transistor 470 might be connected to the voltage node 480 by biasing the control signal senb to a voltage level sufficient to activate the transistor 478, and at time t7, the sense transistor 470 might be isolated from the voltage node 480 by biasing the control signal senb to a voltage level insufficient to activate the transistor 478. During the period between time t6 and t7, a state of the sense node tc might be determined to indicate whether or not the memory cell has a threshold voltage higher than the target verify voltage 665. In this manner, a determination can be made whether the memory cell has exceeded a threshold voltage corresponding to its intended data state, whether the memory cell has a threshold voltage deemed to be near its intended data state, or whether the memory cell has a threshold voltage deemed to be far from its intended data state.

Although the discussion related to FIGS. 6A and 6B involved two verify voltage levels, e.g., a target verify voltage 665 and an intermediate verify voltage 667, an additional verify voltage level might be used when incorporating SSPC programming into embodiments. For example, a voltage level between the target verify voltage 665 and the intermediate verify voltage 667 might be used to determine whether a memory cell deemed to have a threshold voltage lower than (or equal to) the target verify voltage 665 for its intended data state, and higher than the intermediate verify voltage 667 should be fully enabled for programming or partially enabled for programming while receiving a next subsequent multi-step programming pulse. Such a voltage level between the target verify voltage 665 and the intermediate verify voltage 667 might be referred to as a secondary intermediate verify voltage, and each possible intended data state for a memory cell might have a corresponding secondary intermediate verify voltage. Determining whether a memory cell might be deemed to have a threshold voltage level lower than (or equal to) its secondary intermediate verify voltage, and higher than its intermediate verify voltage, could be made by incorporating an additional boosting level, and an additional toggling of the control signal senb for sensing at that additional boosting level, in a manner similar to that already described with reference to FIGS. 6A and 6B.

Figure 7:
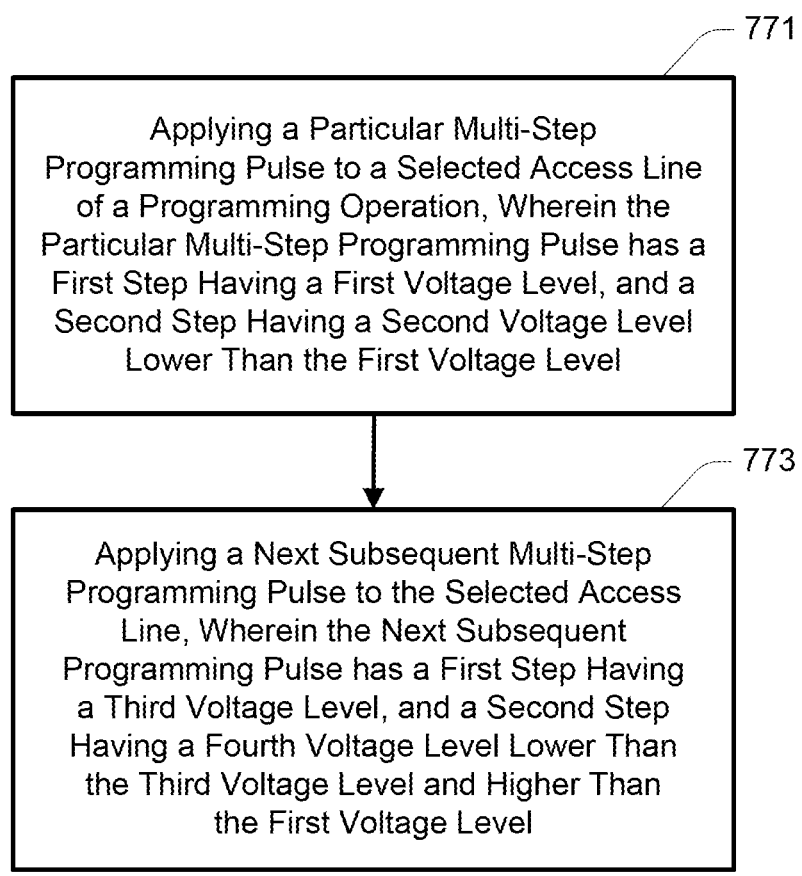
FIG. 7 is a flowchart of a method of operating a memory in accordance with an embodiment.

FIG. 7 is a flowchart of a method of operating a memory, e.g., a method of programming a memory, in accordance with an embodiment. A controller of the memory, e.g., the control logic 116 of the memory 100 of FIG. 1, may be configured to perform the method of FIG. 7.

At 771, a particular multi-step programming pulse is applied to an access line selected for a programming operation. The access line might be connected to a plurality of memory cells selected for the programming operation, e.g., of a logical page of memory cells. The plurality of memory cells selected for the programming operation might include memory cells collectively having a single or a plurality of intended data states. For example, each memory cell of the plurality of memory cells selected for the programming operation might have the same intended data state, or a memory cell of the plurality of memory cells selected for the programming operation might have a different intended data state than a different memory cell of the plurality of memory cells selected for the programming operation. The particular multi-step programming pulse has a first step having a first voltage level and a second step having a second voltage level lower than the first voltage level.

An initial programming pulse might be applied to the selected access line during the programming operation prior to applying the particular multi-step programming pulse. The initial programming pulse might be a single step programming pulse. The initial programming pulse might have a voltage level (e.g., maximum voltage level) that is less than the second voltage level. While applying the initial programming pulse, each memory cell of the plurality of memory cells selected for the programming operation might be enabled for programming. A verify operation might be performed after the initial programming pulse and prior to the particular multi-step programming pulse. It is noted that a memory cell having an intended data state corresponding to a lowest data state of a plurality of data states, e.g., an erased state, is deemed to not be selected for the programming operation, and any other memory cell reaching its intended data state is no longer deemed to be selected for the programming operation.

While the first step of the particular multi-step programming pulse is applied to the selected access line, a first subset of memory cells of the plurality of memory cells selected for the programming operation might be enabled for programming while a second subset (e.g., mutually exclusive subset) of memory cells of the plurality of memory cells selected for the programming operation might be inhibited from programming. The first subset of memory cells might correspond to memory cells deemed to be farther from their intended data state, prior to applying the particular multi-step programming pulse, than memory cells of the second subset of memory cells. For example, the first subset of memory cells may be those memory cells whose threshold voltage is deemed to be lower than (or equal to) the intermediate verify voltage for their respective intended data state, and the second subset of memory cells may be those memory cells whose threshold voltage is deemed to be lower than (or equal to) the target verify voltage for their respective intended data state, and higher than the intermediate verify voltage for their respective intended data state. An additional subset of memory cells of the plurality of memory cells selected for the programming operation might also be inhibited from programming during the first step of the particular multi-step programming pulse, e.g., memory cells that have reached their intended data state prior to applying the particular multi-step programming pulse or are otherwise intended to be inhibited from programming during the particular multi-step programming pulse, e.g., memory cells of a different logical page of memory cells of a same physical page of memory cells.

While the second step of the particular multi-step programming pulse is applied to the selected access line, the second subset of memory cells might be enabled for programming, which may include selectively slowing a rate of programming using techniques such as SSPC. The first subset of memory cells might remain enabled for programming, or they might be inhibited from programming during the second step of the particular multi-step programming pulse. Although enabled for programming, the first subset of memory cells might not be expected to experience a further change in threshold voltage as a result of applying the second step of the particular multi-step programming pulse due to its lower voltage level relative to the first step of the particular multi-step programming pulse.

At 773, a next subsequent multi-step programming pulse is applied to the selected access line. The particular multi-step programming pulse and the next subsequent multi-step programming pulse might be immediately adjacent programming pulses. For example, there may be a verify operation between the two programming pulses, but no intervening programming pulses or other application of a voltage intended to increase the threshold voltage of a memory cell connected to the selected access line. The next subsequent multi-step programming pulse has a first step having a third voltage level and a second step having a fourth voltage level lower than the third voltage level and higher than the first voltage level. A voltage difference between the first voltage level and the second voltage level may be substantially equal to (e.g., equal to) a voltage difference between the third voltage level and the fourth voltage level. A voltage difference between the third voltage level and the first voltage level may be substantially equal to (e.g., equal to) a voltage difference between the fourth voltage level and the second voltage level. A voltage difference between the third voltage level and the first voltage level may be substantially equal to (e.g., equal to) two times a voltage difference between the first voltage level and the second voltage level, and a voltage difference between the fourth voltage level and the second voltage level may be substantially equal to (e.g., equal to) two times the voltage difference between the first voltage level and the second voltage level. A voltage difference between the fourth voltage level and the first voltage level may be substantially equal to (e.g., equal to) a voltage difference between the first voltage level and the second voltage level.

While the first step of the next subsequent multi-step programming pulse is applied to the selected access line, a third subset of memory cells of the plurality of memory cells selected for the programming operation might be enabled for programming while a fourth subset (e.g., mutually exclusive subset) of memory cells of the plurality of memory cells selected for the programming operation might be inhibited from programming. The third subset of memory cells might correspond to memory cells deemed to be farther from their intended data state, after applying the particular multi-step programming pulse and prior to applying the next subsequent multi-step programming pulse, than memory cells of the fourth subset of memory cells. For example, the third subset of memory cells may be those memory cells whose threshold voltage is deemed to be lower than (or equal to) the intermediate verify voltage for their respective intended data state, and the fourth subset of memory cells may be those memory cells whose threshold voltage is deemed to be lower than (or equal to) the target verify voltage for their respective intended data state, and higher than the intermediate verify voltage for their respective intended data state. An additional subset of memory cells of the plurality of memory cells selected for the programming operation might also be inhibited from programming during the first step of the next subsequent multi-step programming pulse, e.g., memory cells that have reached their intended data state prior to applying the next subsequent multi-step programming pulse or are otherwise intended to be inhibited from programming during the next subsequent multi-step programming pulse.

The third subset of memory cells might include all memory cells, or fewer than all memory cells, of the first subset of memory cells. The fourth subset of memory cells might include all memory cells, or fewer than all memory cells, of the first subset of memory cells, and further might include all memory cells, or fewer than all memory cells, of the second subset of memory cells. For example, a memory cell of the first subset of memory cells having a threshold voltage lower than (or equal to) the intermediate verify voltage for its respective intended data state prior to application of the particular multi-step programming pulse, and having a threshold voltage higher than the intermediate verify voltage for its respective intended data state and lower than (or equal to) the target verify voltage for its respective intended data state after application of the particular multi-step programming pulse, might be included in the fourth subset of memory cells. Similarly, a memory cell of the second subset of memory cells having a threshold voltage lower than (or equal to) the target verify voltage for its respective intended data state and higher than the intermediate verify voltage for its respective intended data state both prior to, and subsequent to, application of the particular multi-step programming pulse, also might be included in the fourth subset of memory cells. Memory cells of the first subset of memory cells and the second subset of memory cells having a threshold voltage higher than the target verify voltage for their respective intended data state subsequent to application of the particular multi-step programming pulse might not be included in either the third subset of memory cells or the fourth subset of memory cells, e.g., they may be members of the additional subset of memory cells.

While the second step of the next subsequent multi-step programming pulse is applied to the selected access line, the fourth subset of memory cells might be enabled for programming, which may include selectively slowing a rate of programming using techniques such as SSPC. The third subset of memory cells might remain enabled for programming, or they might be inhibited from programming during the second step of the next subsequent multi-step programming pulse. Although enabled for programming, the third subset of memory cells might not be expected to experience a further change in threshold voltage as a result of applying the second step of the next subsequent multi-step programming pulse due to its lower voltage level relative to the first step of the next subsequent multi-step programming pulse.

The particular multi-step programming pulse and the next subsequent multi-step programming pulse might each have a same number of steps. The particular multi-step programming pulse and the next subsequent multi-step programming pulse might each have only two steps. The first step of the next subsequent multi-step programming pulse might correspond to the first step of the particular multi-step programming pulse. For example, the first step of the next subsequent multi-step programming pulse might occur in the same position of its order of steps as the first step of the particular multi-step programming pulse for its order of steps. The first step of the particular multi-step programming pulse and the first step of the next subsequent multi-step programming pulse might occur subsequent to the second step of the particular multi-step programming pulse and the second step of the next subsequent multi-step programming pulse, respectively.

Figure 8:
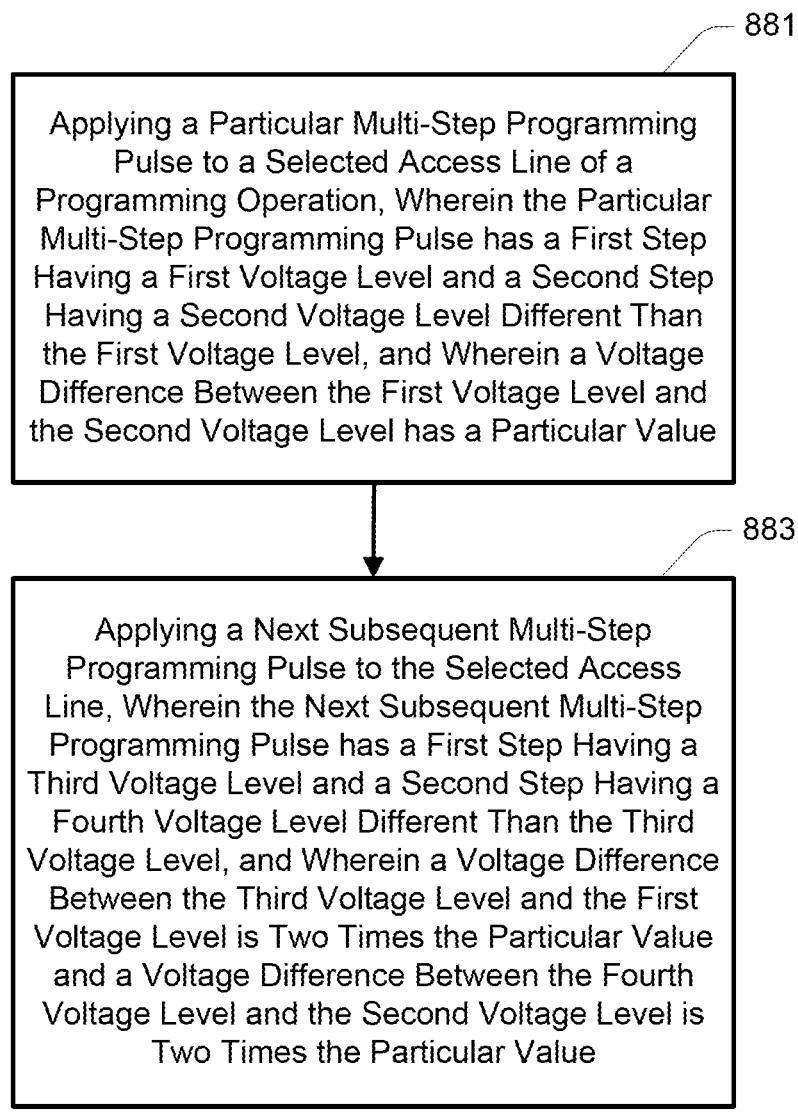
FIG. 8 is a flowchart of a method of operating a memory in accordance with another embodiment.

FIG. 8 is a flowchart of a method of operating a memory, e.g., a method of programming a memory, in accordance with another embodiment. A controller of the memory, e.g., the control logic 116 of the memory 100 of FIG. 1, may be configured to perform the method of FIG. 8.

At 881, a particular multi-step programming pulse is applied to an access line selected for a programming operation. The access line might be connected to a plurality of memory cells selected for the programming operation, e.g., of a logical page of memory cells. The plurality of memory cells selected for the programming operation might include memory cells collectively having a single or a plurality of intended data states. For example, each memory cell of the plurality of memory cells selected for the programming operation might have the same intended data state, or a memory cell of the plurality of memory cells selected for the programming operation might have a different intended data state than a different memory cell of the plurality of memory cells selected for the programming operation. The particular multi-step programming pulse has a first step having a first voltage level and a second step having a second voltage level different than (e.g., lower than) the first voltage level. A voltage difference between the first voltage level and the second voltage level might have a particular value, e.g., 500 mV.

An initial programming pulse might be applied to the selected access line during the programming operation prior to applying the particular multi-step programming pulse. The initial programming pulse might be a single step programming pulse. The initial programming pulse might have a voltage level (e.g., maximum voltage level) that is less than the second voltage level. While applying the initial programming pulse, each memory cell of the plurality of memory cells selected for the programming operation might be enabled for programming. A verify operation might be performed after the initial programming pulse and prior to the particular multi-step programming pulse. It is noted that a memory cell having an intended data state corresponding to a lowest data state of a plurality of data states, e.g., an erased state, is deemed to not be selected for the programming operation, and any other memory cell reaching its intended data state is no longer deemed to be selected for the programming operation.

While the first step of the particular multi-step programming pulse is applied to the selected access line, a first subset of memory cells of the plurality of memory cells selected for the programming operation might be enabled for programming while a second subset (e.g., mutually exclusive subset) of memory cells of the plurality of memory cells selected for the programming operation might be inhibited from programming. The first subset of memory cells might correspond to memory cells deemed to be farther from their intended data state, prior to applying the particular multi-step programming pulse, than memory cells of the second subset of memory cells. For example, the first subset of memory cells may be those memory cells whose threshold voltage is deemed to be lower than (or equal to) the intermediate verify voltage for their respective intended data state, and the second subset of memory cells may be those memory cells whose threshold voltage is deemed to be lower than (or equal to) the target verify voltage for their respective intended data state, and higher than the intermediate verify voltage for their respective intended data state. An additional subset of memory cells of the plurality of memory cells selected for the programming operation might also be inhibited from programming during the first step of the particular multi-step programming pulse, e.g., memory cells that have reached their intended data state prior to applying the particular multi-step programming pulse or are otherwise intended to be inhibited from programming during the particular multi-step programming pulse.

While the second step of the particular multi-step programming pulse is applied to the selected access line, the second subset of memory cells might be enabled for programming, which may include selectively slowing a rate of programming using techniques such as SSPC. The first subset of memory cells might remain enabled for programming, or they might be inhibited from programming during the second step of the particular multi-step programming pulse. Although enabled for programming, the first subset of memory cells might not be expected to experience a further change in threshold voltage as a result of applying the second step of the particular multi-step programming pulse due to its lower voltage level relative to the first step of the particular multi-step programming pulse.

At 883, a next subsequent multi-step programming pulse is applied to the selected access line. The particular multi-step programming pulse and the next subsequent multi-step programming pulse might be immediately adjacent programming pulses. For example, there may be a verify operation between the two programming pulses, but no intervening programming pulses or other application of a voltage intended to increase the threshold voltage of a memory cell connected to the selected access line. The next subsequent multi-step programming pulse has a first step having a third voltage level and a second step having a fourth voltage level different than (e.g., lower than) the third voltage level. A voltage difference between the third voltage level and the first voltage level may be substantially equal to (e.g., equal to) two times the particular value, and a voltage difference between the fourth voltage level and the second voltage level may be substantially equal to (e.g., equal to) two times the particular value.

While the first step of the next subsequent multi-step programming pulse is applied to the selected access line, a third subset of memory cells of the plurality of memory cells selected for the programming operation might be enabled for programming while a fourth subset (e.g., mutually exclusive subset) of memory cells of the plurality of memory cells selected for the programming operation might be inhibited from programming. The third subset of memory cells might correspond to memory cells deemed to be farther from their intended data state, after applying the particular multi-step programming pulse and prior to applying the next subsequent multi-step programming pulse, than memory cells of the fourth subset of memory cells. For example, the third subset of memory cells may be those memory cells whose threshold voltage is deemed to be lower than (or equal to) the intermediate verify voltage for their respective intended data state, and the fourth subset of memory cells may be those memory cells whose threshold voltage is deemed to be lower than (or equal to) the target verify voltage for their respective intended data state, and higher than the intermediate verify voltage for their respective intended data state. An additional subset of memory cells of the plurality of memory cells selected for the programming operation might also be inhibited from programming during the first step of the next subsequent multi-step programming pulse, e.g., memory cells that have reached their intended data state prior to applying the next subsequent multi-step programming pulse or are otherwise intended to be inhibited from programming during the next subsequent multi-step programming pulse.

The third subset of memory cells might include all memory cells, or fewer than all memory cells, of the first subset of memory cells. The fourth subset of memory cells might include all memory cells, or fewer than all memory cells, of the first subset of memory cells, and further might include all memory cells, or fewer than all memory cells, of the second subset of memory cells. For example, a memory cell of the first subset of memory cells having a threshold voltage lower than (or equal to) the intermediate verify voltage for its respective intended data state prior to application of the particular multi-step programming pulse, and having a threshold voltage higher than the intermediate verify voltage for its respective intended data state and lower than (or equal to) the target verify voltage for its respective intended data state after application of the particular multi-step programming pulse, might be included in the fourth subset of memory cells. Similarly, a memory cell of the second subset of memory cells having a threshold voltage lower than (or equal to) the target verify voltage for its respective intended data state and higher than the intermediate verify voltage for its respective intended data state both prior to, and subsequent to, application of the particular multi-step programming pulse, also might be included in the fourth subset of memory cells. Memory cells of the first subset of memory cells and the second subset of memory cells having a threshold voltage higher than the target verify voltage for their respective intended data state subsequent to application of the particular multi-step programming pulse might not be included in either the third subset of memory cells or the fourth subset of memory cells, e.g., they may be members of the additional subset of memory cells.

While the second step of the next subsequent multi-step programming pulse is applied to the selected access line, the fourth subset of memory cells might be enabled for programming, which may include selectively slowing a rate of programming using techniques such as SSPC. The third subset of memory cells might remain enabled for programming, or they might be inhibited from programming during the second step of the next subsequent multi-step programming pulse. Although enabled for programming, the third subset of memory cells might not be expected to experience a further change in threshold voltage as a result of applying the second step of the next subsequent multi-step programming pulse due to its lower voltage level relative to the first step of the next subsequent multi-step programming pulse.

The particular multi-step programming pulse and the next subsequent multi-step programming pulse might each have a same number of steps. The particular multi-step programming pulse and the next subsequent multi-step programming pulse might each have only two steps. The first step of the next subsequent multi-step programming pulse might correspond to the first step of the particular multi-step programming pulse. For example, the first step of the next subsequent multi-step programming pulse might occur in the same position of its order of steps as the first step of the particular multi-step programming pulse for its order of steps. The first step of the particular multi-step programming pulse and the first step of the next subsequent multi-step programming pulse might occur subsequent to the second step of the particular multi-step programming pulse and the second step of the next subsequent multi-step programming pulse, respectively.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
    an array of memory cells; and
    a controller configured to access the array of memory cells;
    wherein the controller is further configured to:
        for a plurality of memory cells of the array of memory cells selected for programming during a programming operation, wherein each memory cell of the plurality of memory cells has a respective intended data state of a plurality of intended data states for the programming operation, determine a first subset of memory cells of the plurality of memory cells, wherein each memory cell of the first subset of memory cells is activated in response to a respective intermediate verify voltage corresponding to its respective intended data state, and determine a second subset of memory cells of the plurality of memory cells, wherein each memory cell of the second subset of memory cells is activated in response to a respective target verify voltage corresponding to its respective intended data state and deactivated in response to the respective intermediate verify voltage corresponding to its respective intended data state;
        apply a particular multi-step programming pulse to a selected access line of the programming operation, wherein the particular multi-step programming pulse has a first step having a first voltage level and a second step having a second voltage level lower than the first voltage level, and wherein the selected access line is connected to the plurality of memory cells;
        enable the first subset of memory cells for programming while applying the first step of the particular multi-step programming pulse;
        inhibit the second subset of memory cells from programming while applying the first step of the particular multi-step programming pulse and enable the second subset of memory cells for programming while applying the second step of the particular multi-step programming pulse; and
        apply a next subsequent multi-step programming pulse to the selected access line, wherein the next subsequent multi-step programming pulse has a first step having a third voltage level and a second step having a fourth voltage level lower than the third voltage level and higher than the first voltage level;
        wherein, for each intended data state of the plurality of intended data states, the respective intermediate verify voltage for that intended data state is lower than the respective target verify voltage for that intended data state.

2. The memory of claim 1, wherein the controller is further configured to:
    determine a third subset of memory cells of the plurality of memory cells, wherein each memory cell of the third subset of memory cells is activated in response to the respective intermediate verify voltage corresponding to its respective intended data state; and
    determine a fourth subset of memory cells of the plurality of memory cells, wherein each memory cell of the fourth subset of memory cells is activated in response to the respective target verify voltage corresponding to its respective intended data state and deactivated in response to the respective intermediate verify voltage corresponding to its respective intended data state.

3. The memory of claim 1, wherein the controller being configured to enable the second subset of memory cells for programming while applying the second step of the particular multi-step programming pulse comprises the controller being configured to partially enable a particular memory cell of the second subset of memory cells for programming while applying the second step of the particular multi-step programming pulse and the controller being configured to fully enable a different memory cell of the second subset of memory cells for programming while applying the second step of the particular multi-step programming pulse.

4. The memory of claim 2, wherein the controller is further configured to:
    enable the third subset of memory cells for programming while applying the first step of the next subsequent multi-step programming pulse;
    inhibit the fourth subset of memory cells from programming while applying the first step of the next subsequent multi-step programming pulse; and
    enable the fourth subset of memory cells for programming while applying the second step of the next subsequent multi-step programming pulse.

5. The memory of claim 1, wherein the controller is further configured to:
    enable the first subset of memory cells for programming before applying the first step of the particular multi-step programming pulse; and
    enable the second subset of memory cells for programming before applying the second step of the particular multi-step programming pulse.

6. The memory of claim 5, wherein the controller is further configured to:
    enable the first subset of memory cells for programming while applying the second step of the particular multi-step programming pulse.

7. The memory of claim 1, wherein a voltage difference between the third voltage level and the fourth voltage level is substantially equal to a voltage difference between the first voltage level and the second voltage level.

8. The memory of claim 1, wherein a voltage difference between the third voltage level and the first voltage level is substantially equal to two times the voltage difference between the first voltage level and the second voltage level.

9. The memory of claim 2, wherein memory cells of the second subset of memory cells contain memory cells deemed to be nearer their respective intended data states than memory cells of the first subset of memory cells.

10. The memory of claim 9, wherein memory cells of the fourth subset of memory cells contain memory cells deemed to be nearer their respective intended data states than memory cells of the third subset of memory cells.

11. The memory of claim 1, wherein the controller is further configured to apply the second step of the particular multi-step programming pulse prior to applying the first step of the particular multi-step programming pulse, and to apply the second step of the next subsequent multi-step programming pulse prior to the first step of the next subsequent multi-step programming pulse.

12. A method of operating a memory, comprising:
    for a plurality of memory cells of the array of memory cells selected for programming during a programming operation, wherein each memory cell of the plurality of memory cells has a respective intended data state of a plurality of intended data states for the programming operation, determining a first subset of memory cells of the plurality of memory cells, wherein each memory cell of the first subset of memory cells is activated in response to a respective intermediate verify voltage corresponding to its respective intended data state, and determining a second subset of memory cells of the plurality of memory cells, wherein each memory cell of the second subset of memory cells is activated in response to a respective target verify voltage corresponding to its respective intended data state and deactivated in response to the respective intermediate verify voltage corresponding to its respective intended data state;

applying a particular multi-step programming pulse to a selected access line of the programming operation, wherein the particular multi-step programming pulse has a first step having a first voltage level and a second step having a second voltage level lower than the first voltage level, and wherein the selected access line is connected to the plurality of memory cells;

enabling the first subset of memory cells for programming while applying the first step of the particular multi-step programming pulse;

inhibiting the second subset of memory cells from programming while applying the first step of the particular multi-step programming pulse and enabling the second subset of memory cells for programming while applying the second step of the particular multi-step programming pulse; and applying a next subsequent multi-step programming pulse to the selected access line, wherein the next subsequent multi-step programming pulse has a first step having a third voltage level and a second step having a fourth voltage level lower than the third voltage level and higher than the first voltage level;

wherein, for each intended data state of the plurality of intended data states, the respective intermediate verify voltage for that intended data state is lower than the respective target verify voltage for that intended data state.

13. The method of claim 12, further comprising:
determining a third subset of memory cells of the plurality of memory cells, wherein each memory cell of the third subset of memory cells is activated in response to the respective intermediate verify voltage corresponding to its respective intended data state; and determining a fourth subset of memory cells of the plurality of memory cells, wherein each memory cell of the fourth subset of memory cells is activated in response to the respective target verify voltage corresponding to its respective intended data state and deactivated in response to the respective intermediate verify voltage corresponding to its respective intended data state.

14. The method of claim 12, further comprising:
performing a verify operation after applying the particular multi-step programming pulse and prior to applying the next subsequent multi-step programming pulse.

15. The method of claim 14, wherein performing the verify operation comprises determining which memory cells of the first subset of memory cells and of the second subset of memory cells are deemed to have a threshold voltage higher than the target verify voltage corresponding to their respective intended data states, which memory cells of the first subset of memory cells and of the second subset of memory cells are deemed to have a threshold voltage lower than the target verify voltage corresponding to their respective intended data states and higher than the intermediate verify voltage corresponding to their respective intended data states, and which memory cells of the first subset of memory cells are deemed to have a threshold voltage lower than the intermediate verify voltage corresponding to their respective intended data states.

16. The method of claim 15, further comprising:
enabling for programming those memory cells of the first subset of memory cells deemed to have a threshold voltage lower than the intermediate verify voltage corresponding to their respective intended data states while applying the first step of the next subsequent multi-step programming pulse;

enabling for programming those memory cells of the first subset of memory cells and the second subset of memory cells deemed to have a threshold voltage lower than the target verify voltage corresponding to their respective intended data states and higher than the intermediate verify voltage corresponding to their respective intended data states while applying the second step of the next subsequent multi-step programming pulse; and inhibiting from programming those memory cells of the first subset of memory cells and the second subset of memory cells deemed to have a threshold voltage higher than the target verify voltage corresponding to their respective intended data states while applying the second step of the next subsequent multi-step programming pulse.

17. The method of claim 15, wherein performing the verify operation further comprises determining which memory cells of the first subset of memory cells and of the second subset of memory cells are deemed to have a threshold voltage lower than or equal to the target verify voltage corresponding to their respective intended data states, and which memory cells of the first subset of memory cells and of the second subset of memory cells are deemed to have a threshold voltage lower than or equal to the intermediate verify voltage corresponding to their respective intended data states.

18. The method of claim 12, wherein enabling the second subset of memory cells for programming while applying the second step of the particular multi-step programming pulse comprises fully enabling a particular memory cell of the second subset of memory cells for programming while applying the second step of the particular multi-step programming pulse, and partially enabling a different memory cell of the second subset of memory cells for programming while applying the second step of the particular multi-step programming pulse.

19. The method of claim 13, further comprising:
enabling the third subset of memory cells for programming while applying the first step of the next subsequent multi-step programming pulse;

inhibiting the fourth subset of memory cells from programming while applying the first step of the next subsequent multi-step programming pulse; and enabling the fourth subset of memory cells for programming while applying the second step of the next subsequent multi-step programming pulse.

20. A memory, comprising:
an array of memory cells; and
a controller configured to access the array of memory cells;
wherein the controller is further configured to:
for a plurality of memory cells of the array of memory cells selected for programming during a programming operation, wherein each memory cell of the plurality of memory cells has a respective intended data state of a plurality of intended data states for the programming operation, determine a first subset of memory cells of the plurality of memory cells, wherein each memory cell of the first subset of memory cells is activated in response to a respective intermediate verify voltage corresponding to its respective intended data state, and determine a second subset of memory cells of the plurality of memory cells, wherein each memory cell of the second subset of memory cells is activated in response to a respective target verify voltage corresponding to its respective intended data state and deactivated in response to the respective intermediate verify voltage corresponding to its respective intended data state;

apply a particular multi-step programming pulse to a selected access line of the programming operation, wherein the particular multi-step programming pulse has a first step having a first voltage level and a second step having a second voltage level different than the first voltage level, wherein a voltage difference between the first voltage level and the second voltage level has a particular value, and wherein the selected access line is connected to the plurality of memory cells;

enable the first subset of memory cells for programming while applying the first step of the particular multi-step programming pulse;

inhibit the second subset of memory cells from programming while applying the first step of the particular multi-step programming pulse and enable the second subset of memory cells for programming while applying the second step of the particular multi-step programming pulse; and apply a next subsequent multi-step programming pulse to the selected access line, wherein the next subsequent multi-step programming pulse has a first step having a third voltage level and a second step having a fourth voltage level different than the third voltage level, and wherein a voltage difference between the third voltage level and the first voltage level is substantially equal to two times the particular value, and a voltage difference between the fourth voltage level and the second voltage level is substantially equal to two times the particular value;

wherein, for each intended data state of the plurality of intended data states, the respective intermediate verify voltage for that intended data state is lower than the respective target verify voltage for that intended data state.

21. The memory of claim 20, wherein the controller is further configured to:

determine a third subset of memory cells of the plurality of memory cells after applying the particular multi-step programming pulse, wherein each memory cell of the third subset of memory cells is activated in response to the respective intermediate verify voltage corresponding to its respective intended data state; and determine a fourth subset of memory cells of the plurality of memory cells after applying the particular multi-step programming pulse, wherein each memory cell of the fourth subset of memory cells is activated in response to the respective target verify voltage corresponding to its respective intended data state and deactivated in response to the respective intermediate verify voltage corresponding to its respective intended data states;

enable the third subset of memory cells for programming while applying the first step of the next subsequent multi-step programming pulse;

inhibit the fourth subset of memory cells from programming while applying the first step of the next subsequent multi-step programming pulse; and enable the fourth subset of memory cells for programming while applying the second step of the next subsequent multi-step programming pulse.

22. The memory of claim 21, wherein the controller being configured to enable the second subset of memory cells for programming while applying the second step of the particular multi-step programming pulse comprises the controller being configured to partially enable a particular memory cell of the second subset of memory cells for programming while applying the second step of the particular multi-step programming pulse and the controller being configured to fully enable a different memory cell of the second subset of memory cells for programming while applying the second step of the particular multi-step programming pulse, and wherein the controller being configured to enable the fourth subset of memory cells for programming while applying the second step of the next subsequent multi-step programming pulse comprises the controller being configured to partially enable a particular memory cell of the fourth subset of memory cells for programming while applying the second step of the next subsequent multi-step programming pulse and the controller being configured to fully enable a different memory cell of the fourth subset of memory cells for programming while applying the second step of the next subsequent multi-step programming pulse.

23. The memory of claim 21, wherein the controller is further configured to:

enable the first subset of memory cells for programming before applying the first step of the particular multi-step programming pulse;

enable the second subset of memory cells for programming before applying the second step of the particular multi-step programming pulse;

enable the third subset of memory cells for programming before applying the first step of the next subsequent multi-step programming pulse; and enable the fourth subset of memory cells for programming before applying the second step of the next subsequent multi-step programming pulse.

24. The memory of claim 23, wherein the controller is further configured to:

enable the first subset of memory cells for programming while applying the second step of the particular multi-step programming pulse; and enable the third subset of memory cells for programming while applying the second step of the next subsequent multi-step programming pulse.

25. The memory of claim 20, wherein second voltage level is lower than the first voltage level, and wherein the fourth voltage level is lower than the third voltage level.

26. The memory of claim 21, wherein memory cells of the second subset of memory cells contain memory cells deemed to be nearer their respective intended data states than memory cells of the first subset of memory cells, and wherein memory cells of the fourth subset of memory cells contain memory cells deemed to be nearer their respective intended data states than memory cells of the third subset of memory cells.

27. A method of operating a memory, comprising:
for a plurality of memory cells of the array of memory cells selected for programming during a programming operation, wherein each memory cell of the plurality of memory cells has a respective intended data state of a plurality of intended data states for the programming operation, determining a first subset of memory cells of the plurality of memory cells, wherein each memory cell of the first subset of memory cells is activated in response to a respective intermediate verify voltage corresponding to its respective intended data state, and determining a second subset of memory cells of the plurality of memory cells, wherein each memory cell of the second subset of memory cells is activated in response to a respective target verify voltage corresponding to its respective intended data state and deactivated in response to the respective intermediate verify voltage corresponding to its respective intended data state;
applying a particular multi-step programming pulse to a selected access line of the programming operation, wherein the particular multi-step programming pulse has a first step having a first voltage level and a second step having a second voltage level different than the first voltage level, wherein a voltage difference between the first voltage level and the second voltage level has a particular value, and wherein the selected access line is connected to the plurality of memory cells;
enabling the first subset of memory cells for programming while applying the first step of the particular multi-step programming pulse;
inhibiting the second subset of memory cells from programming while applying the first step of the particular multi-step programming pulse and enabling the second subset of memory cells for programming while applying the second step of the particular multi-step programming pulse; and
applying a next subsequent multi-step programming pulse to the selected access line, wherein the next subsequent multi-step programming pulse has a first step having a third voltage level and a second step having a fourth voltage level different than the third voltage level, and wherein a voltage difference between the third voltage level and the first voltage level is substantially equal to two times the particular value, and a voltage difference between the fourth voltage level and the second voltage level is substantially equal to two times the particular value;
wherein, for each intended data state of the plurality of intended data states, the respective intermediate verify voltage for that intended data state is lower than the respective target verify voltage for that intended data state.

28. The method of claim 27, further comprising:
determining a third subset of memory cells of the plurality of memory cells after applying the particular multi-step programming pulse, wherein each memory cell of the third subset of memory cells is activated in response to the respective intermediate verify voltage corresponding to its respective intended data state;
determining a fourth subset of memory cells of the plurality of memory cells after applying the particular multi-step programming pulse, wherein each memory cell of the fourth subset of memo r cells is activated in response to the respective target verify voltage corresponding to its respective intended data state and deactivated in response to the respective intermediate verify voltage corresponding to its respective intended data state;
enabling the third subset of memory cells for programming while applying the first step of the next subsequent multi-step programming pulse;
inhibiting the fourth subset of memory cells from programming while applying the first step of the next subsequent multi-step programming pulse; and
enabling the fourth subset of memory cells for programming while applying the second step of the next subsequent multi-step programming pulse.

29. The method of claim 28, further comprising:
performing a verify operation after applying the particular multi-step programming pulse and prior to applying the next subsequent multi-step programming pulse.

30. The method of claim 29, wherein performing the verify operation comprises determining which memory cells of the first subset of memory cells and of the second subset of memory cells are deemed to have a threshold voltage higher than the target verify voltage corresponding to their respective intended data states, which memory cells of the first subset of memory cells and of the second subset of memory cells are deemed to have a threshold voltage lower than the target verify voltage corresponding to their respective intended data states and higher than the intermediate verify voltage corresponding to their respective intended data states, and which memory cells of the first subset of memory cells are deemed to have a threshold voltage lower than the intermediate verify voltage corresponding to their respective intended data states.

31. The method of claim 30, further comprising:
enabling for programming those memory cells of the first subset of memory cells deemed to have a threshold voltage lower than the intermediate verify voltage corresponding to their respective intended data states while applying the first step of the next subsequent multi-step programming pulse;
enabling for programming those memory cells of the first subset of memory cells and the second subset of memory cells deemed to have a threshold voltage lower than the target verify voltage corresponding to their respective intended data states and higher than the intermediate verify voltage corresponding to their respective intended data states while applying the second step of the next subsequent multi-step programming pulse; and
inhibiting from programming those memory cells of the first subset of memory cells and the second subset of memory cells deemed to have a threshold voltage higher than the target verify voltage corresponding to their respective intended data states while applying the second step of the next subsequent multi-step programming pulse.

32. The method of claim 30, wherein performing the verify operation further comprises determining which memory cells of the first subset of memory cells and of the second subset of memory cells are deemed to have a threshold voltage lower than or equal to the target verify voltage corresponding to their respective intended data states, and which memory cells of the first subset of memory cells and of the second subset of memory cells are deemed to have a threshold voltage lower than or equal to the intermediate verify voltage corresponding to their respective intended data states.

33. The method of claim 28, wherein enabling the second subset of memory cells for programming while applying the second step of the particular multi-step programming pulse comprises fully enabling a particular memory cell of the second subset of memory cells for programming while applying the second step of the particular multi-step programming pulse, and partially enabling a different memory cell of the second subset of memory cells for programming while applying the second step of the particular multi-step programming pulse.

* * * * *

UNITED STATES PATENT AND TRADEMARK OFFICE
CERTIFICATE OF CORRECTION

PATENT NO.         : 10,741,252 B2                                              Page 1 of 1
APPLICATION NO.    : 16/223305
DATED              : August 11, 2020
INVENTOR(S)        : Lee It is certified that error appears in the above-identified patent and that said Letters Patent is hereby corrected as shown below:

In the Claims

Column 33, Line 65, delete "of memo r cells" and insert in place thereof --of memory cells--.

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*